(12) United States Patent
Golda et al.

(10) Patent No.: US 8,569,115 B1
(45) Date of Patent: Oct. 29, 2013

(54) METHOD OF FORMING A COMPLIANT BIPOLAR MICRO DEVICE TRANSFER HEAD WITH SILICON ELECTRODES

(75) Inventors: Dariusz Golda, Redwood City, CA (US); Andreas Bibl, Los Altos, CA (US)

(73) Assignee: LuxVue Technology Corporation, Santa Clara, CA (US)

( * ) Notice: Subject to any disclaimer, the term of this patent is extended or adjusted under 35 U.S.C. 154(b) by 10 days.

(21) Appl. No.: 13/543,680

(22) Filed: Jul. 6, 2012

(51) Int. Cl.
*H01L 21/82* (2006.01)
(52) U.S. Cl.
USPC ............. 438/130; 438/39; 438/128; 438/158; 438/250; 438/251; 257/619; 257/623; 257/774; 257/E29.324
(58) Field of Classification Search
USPC .......... 257/619, 623, 774, E29.324; 438/130, 438/128, 158, 250, 251, 253, 254, 261, 263, 438/276, 30, 39, 396
See application file for complete search history.

(56) References Cited

U.S. PATENT DOCUMENTS

| | | | |
|---|---|---|---|
| 4,837,176 A * | 6/1989 | Zdebel et al. ................. | 438/552 |
| 5,067,002 A * | 11/1991 | Zdebel et al. ................. | 257/756 |
| 5,110,752 A * | 5/1992 | Lu ................................ | 438/398 |
| 5,266,514 A * | 11/1993 | Tuan et al. .................... | 438/398 |
| 5,592,358 A | 1/1997 | Shamouilian et al. | |
| 5,640,133 A | 6/1997 | MacDonald et al. | |
| 5,745,331 A | 4/1998 | Shamouilian et al. | |
| 5,839,187 A | 11/1998 | Sato et al. | |
| 5,851,664 A | 12/1998 | Bennett et al. | |
| 5,888,847 A | 3/1999 | Rostoker et al. | |
| 5,903,428 A | 5/1999 | Grimard et al. | |
| 5,996,218 A | 12/1999 | Shamouilian et al. | |
| 6,071,795 A | 6/2000 | Cheung et al. | |
| 6,335,263 B1 | 1/2002 | Cheung et al. | |
| 6,379,929 B1 * | 4/2002 | Burns et al. .................. | 435/91.2 |
| 6,403,985 B1 | 6/2002 | Fan et al. | |
| 6,420,242 B1 | 7/2002 | Cheung et al. | |
| 6,521,511 B1 | 2/2003 | Inoue et al. | |
| 6,558,109 B2 | 5/2003 | Gibbel | |
| 6,613,610 B2 | 9/2003 | Iwafuchi et al. | |
| 6,629,553 B2 | 10/2003 | Odashima et al. | |
| 6,670,038 B2 | 12/2003 | Sun et al. | |
| 6,786,390 B2 | 9/2004 | Yang et al. | |

(Continued)

FOREIGN PATENT DOCUMENTS

JP 3406207 5/1999
WO WO 2011/123285 10/2011

OTHER PUBLICATIONS

Hossick-Schott, Joachim, "Prospects for the ultimate energy density of oxide-based capacitor anodes" Proceedings of CARTS Europe, Barcelona, Spain, 2007, 10 pgs.

(Continued)

*Primary Examiner* — Telly Green
(74) *Attorney, Agent, or Firm* — Blakely Sokoloff Taylor & Zafman LLP

(57) ABSTRACT

A compliant bipolar micro device transfer head array and method of forming a compliant bipolar micro device transfer array from an SOI substrate are described. In an embodiment, a compliant bipolar micro device transfer head array includes a base substrate and a patterned silicon layer over the base substrate. The patterned silicon layer may include first and second silicon interconnects, and first and second arrays of silicon electrodes electrically connected with the first and second silicon interconnects and deflectable into one or more cavities between the base substrate and the silicon electrodes.

26 Claims, 20 Drawing Sheets

(56) References Cited

U.S. PATENT DOCUMENTS

| | | | |
|---|---|---|---|
| 6,825,105 B2* | 11/2004 | Grover et al. ............... 438/570 |
| 6,878,607 B2 | 4/2005 | Inoue et al. |
| 7,033,842 B2 | 4/2006 | Haji et al. |
| 7,148,127 B2 | 12/2006 | Oohata et al. |
| 7,208,337 B2 | 4/2007 | Eisert et al. |
| 7,335,527 B2 | 2/2008 | Sawyer et al. |
| 7,353,596 B2 | 4/2008 | Shida et al. |
| 7,358,158 B2 | 4/2008 | Aihara et al. |
| 7,585,703 B2 | 9/2009 | Matsumura et al. |
| 7,723,764 B2 | 5/2010 | Oohata et al. |
| 7,785,481 B2 | 8/2010 | Wang |
| 7,795,629 B2 | 9/2010 | Watanabe et al. |
| 7,797,820 B2 | 9/2010 | Shida et al. |
| 7,829,366 B2 | 11/2010 | Miller et al. |
| 7,838,410 B2 | 11/2010 | Hirao et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,929,195 B2 | 4/2011 | Bifano |
| 7,972,875 B2 | 7/2011 | Rogers et al. |
| 7,999,454 B2 | 8/2011 | Winters et al. |
| 8,023,248 B2 | 9/2011 | Yonekura et al. |
| 8,383,506 B1 | 2/2013 | Golda et al. |
| 2001/0029088 A1 | 10/2001 | Odajima et al. |
| 2002/0076848 A1 | 6/2002 | Spooner et al. |
| 2002/0168671 A1* | 11/2002 | Burns et al. ............... 435/6 |
| 2002/0172969 A1* | 11/2002 | Burns et al. ............... 435/6 |
| 2003/0022474 A1* | 1/2003 | Grover et al. ............... 438/570 |
| 2003/0177633 A1 | 9/2003 | Haji et al. |
| 2004/0161943 A1 | 8/2004 | Ren et al. |
| 2007/0166851 A1 | 7/2007 | Tran et al. |
| 2008/0048520 A1 | 2/2008 | Gulvin et al. |
| 2008/0163481 A1 | 7/2008 | Shida et al. |
| 2009/0068774 A1 | 3/2009 | Slater et al. |
| 2009/0314991 A1 | 12/2009 | Cho et al. |
| 2010/0039747 A1 | 2/2010 | Sansoni et al. |
| 2010/0046134 A1 | 2/2010 | Mizuno et al. |
| 2010/0142114 A1 | 6/2010 | Purohit et al. |
| 2010/0149720 A1 | 6/2010 | Fujisawa et al. |
| 2010/0188794 A1 | 7/2010 | Park et al. |
| 2010/0248484 A1 | 9/2010 | Bower et al. |
| 2011/0003410 A1 | 1/2011 | Tsay et al. |
| 2012/0064642 A1 | 3/2012 | Huang et al. |
| 2012/0134065 A1 | 5/2012 | Furuya et al. |

OTHER PUBLICATIONS

LuxVue Technology Corporation Office Action for U.S. Appl. No. 13/543,675 mailed Sep. 24, 2012.
LuxVue Technology Corporation Notice of Allowance for U.S. Appl. No. 13/481,592 mailed Dec. 7, 2012.
LuxVue Technology Corporation Office Action for U.S. Appl. No. 13/481,592 mailed Aug. 15, 2012.
LuxVue Technology Corporation Notice of Allowance for U.S. Appl. No. 13/543,675 mailed Jan. 8, 2013.
LuxVue Technology Corporation Notice of Allowance for U.S. Appl. No. 13/543,684 mailed Jan. 11, 2013.
LuxVue Technology Corporation Office Action for U.S. Appl. No. 13/543,684 mailed Sep. 24, 2012.
LuxVue Technology Corporation Notice of Allowance for U.S. Appl. No. 13/543,690 mailed Oct. 22, 2012.
Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.
Bower, C.A., et al., "Active-Matrix OLED Display Backplanes Using Transfer-Printed Microscale Integrated Circuits", IEEE, 2010 Electronic Components and Technology Conference, pp. 1339-1343.
"Characteristics of electrostatic Chuck(ESC)" Advanced Materials Research Group, New Technology Research Laborotory, 2000, pp. 51-53 accessed at http://www.socnb.com/report/ptech_e/2000p51_e.pdf.
Guerre, Roland, et al, "Selective Transfer Technology for Microdevice Distribution" Journal of Microelectromechanical Systems, vol. 17, No. 1, Feb. 2008, pp. 157-165.
Han, Min-Koo, "AM backplane for AMOLED" Proc. of ASID '06, Oct. 8-12, New Delhi, pp. 53-58.
Harris, Jonathan H., "Sintered Aluminum Nitride Ceramics for High-Power Electronic Applications" Journal of the Minerals, Metals and Materials Society, vol. 50, No. 6, Jun. 1998, p. 56.
Horwitz, Chris M., "Electrostatic Chucks: Frequently Asked Questions" Electrogrip, 2006, 10 pgs, accessed at www.electrogrip.com.
Hossick-Schott, Joachim, "Prospects for the ultimate energy density of oxide-based capacitor anodes" Medtronic Energy and Components Center, 10 pgs.
Lee, SanYoul, et al., "Wafer-level fabrication of GAN-based vertical light-emitting diodes using a multi-functional bonding material system" Semicond. Sci. Technol. 24, 2009, 4 pgs.
"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.
Mei, Zequn, et al., "Low_Temperature Solders" Hewlett-Packard Journal, Article 10, Aug. 1996, pp. 1-10.
Mercado, Lei, L., et al., "A Mechanical Approach to Overcome RF MEMS Switch Stiction Problem" 2003 Electronic Components and Technology Conference, pp. 377-384.
Miskys, Claudio R., et al., "Freestanding GaN-substrates and devices" phys. Stat. sol. © 0, No. 6, 2003, pp. 1627-1650.
"Principles of Electrostatic Chucks: 1—Techniques for High Performance Grip and Release" ElectroGrip, Principles1 rev3 May 2006, 2 pgs, accessed at www.electrogrip.com.
Steigerwald, Daniel, et al., "III-V Nitride Semiconductors for High-Perfromance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.
Widas, Robert, "Electrostatic Substrate Clamping for Next Generation Semiconductor Devices" Apr. 21, 1999, 4 pgs.

* cited by examiner

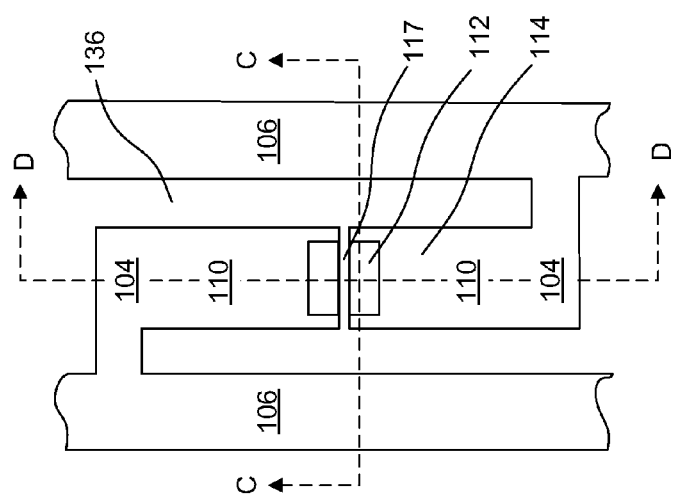
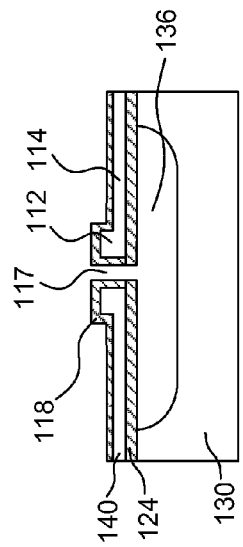
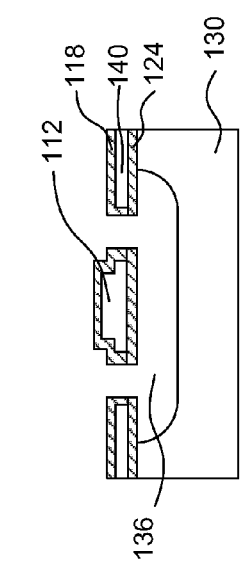
FIG. 1B
FIG. 1D
FIG. 1C

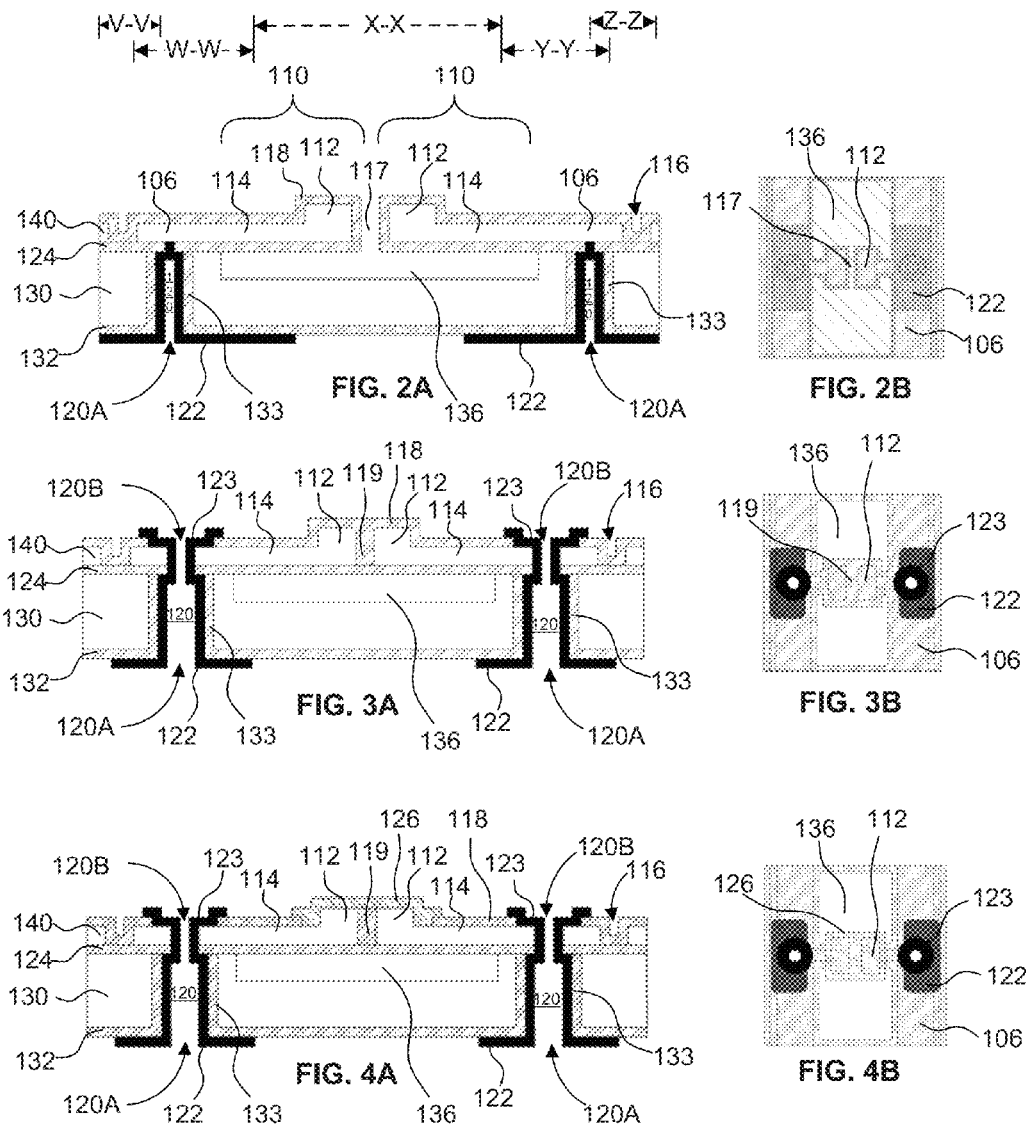

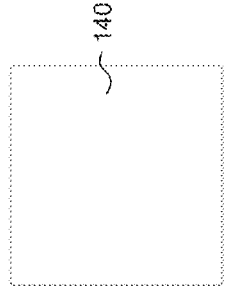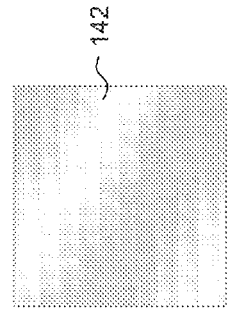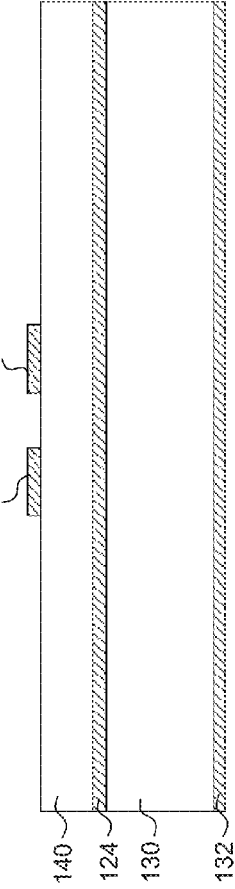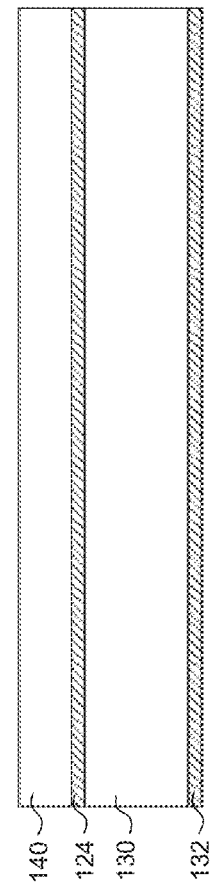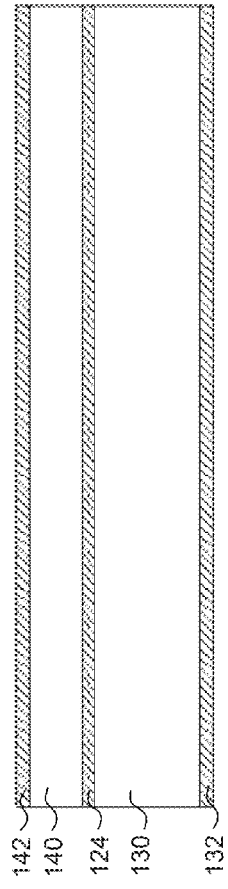

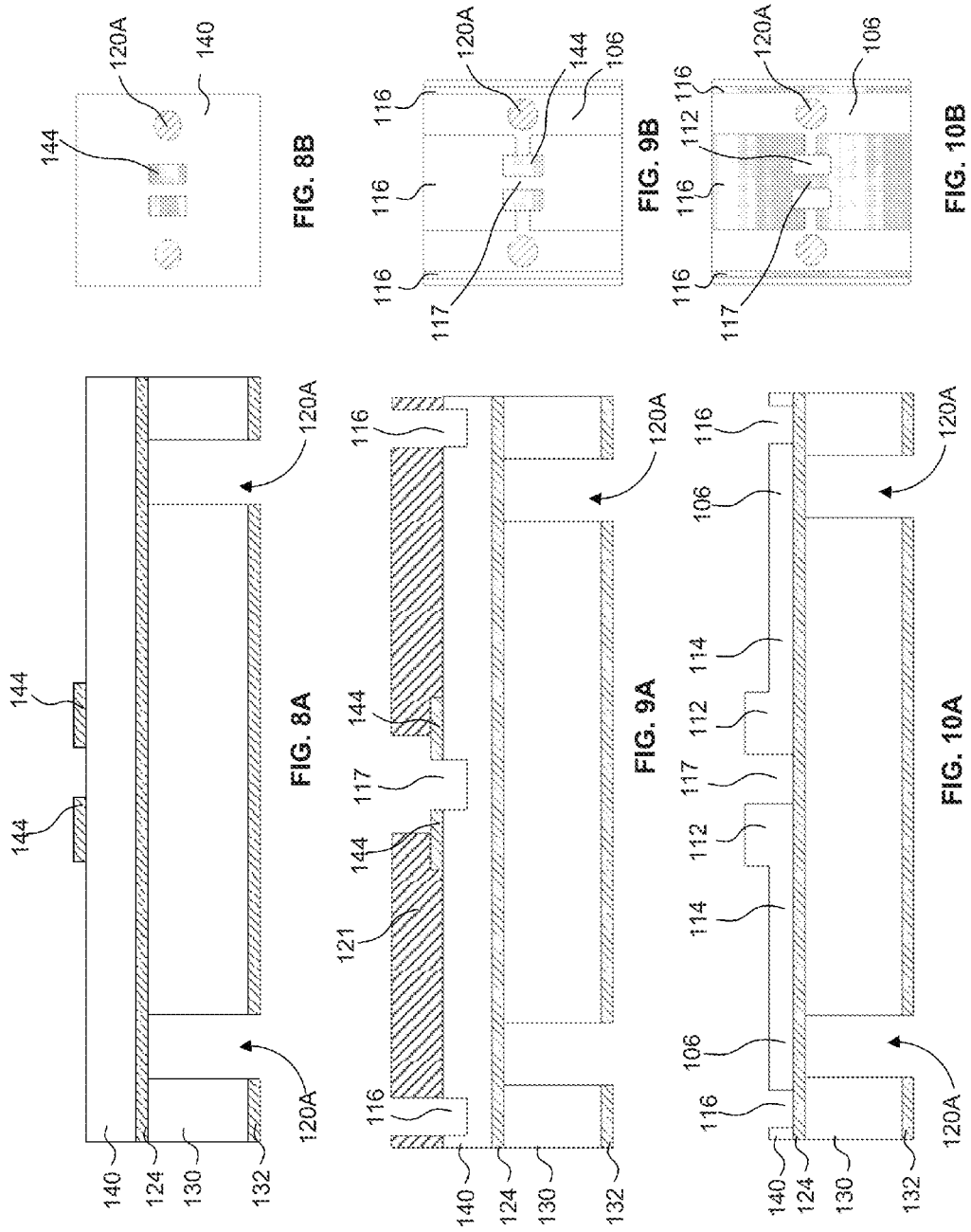

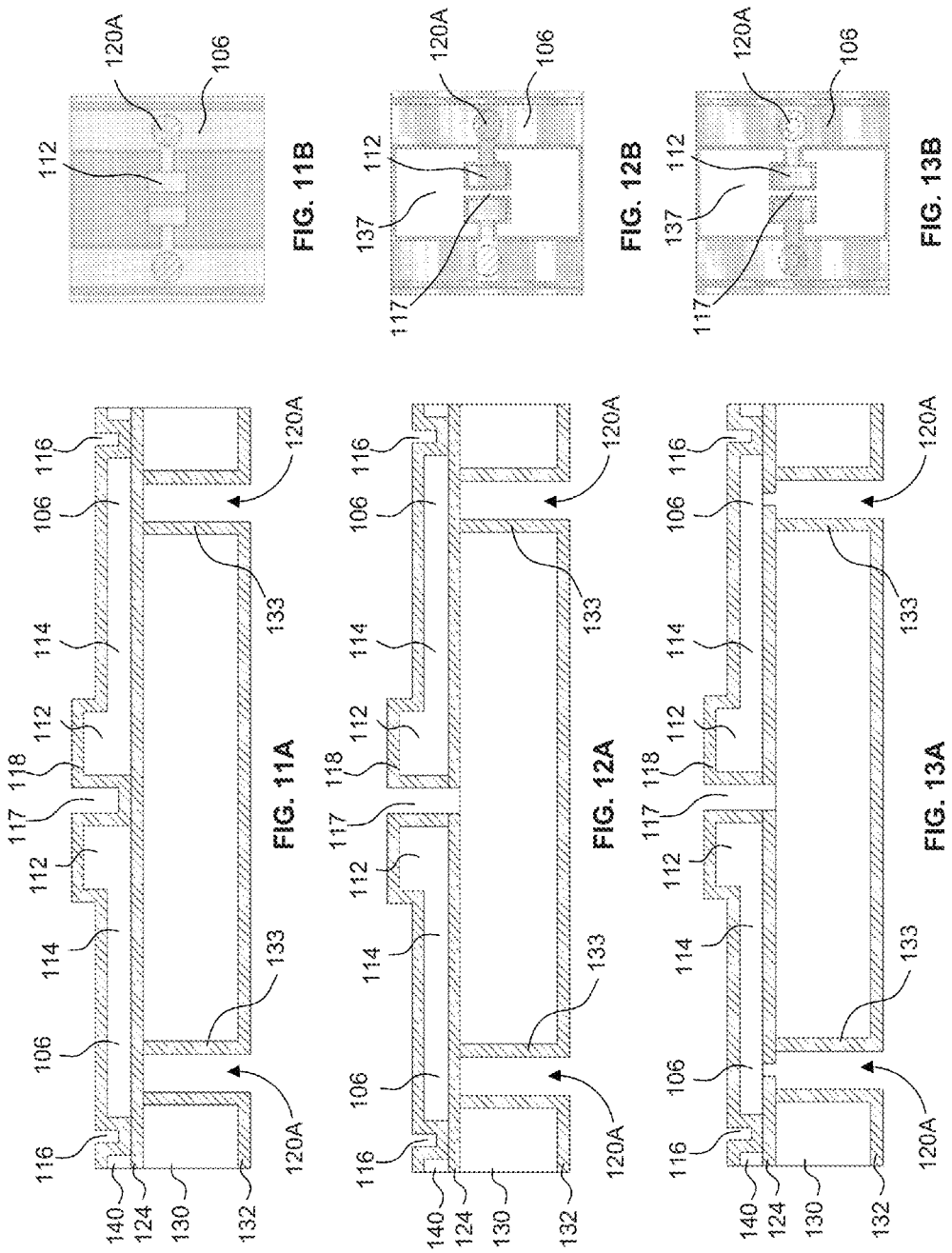

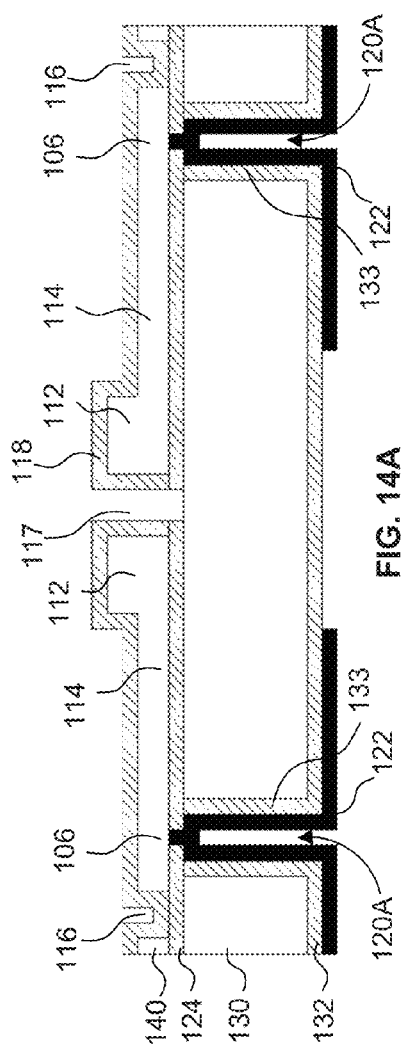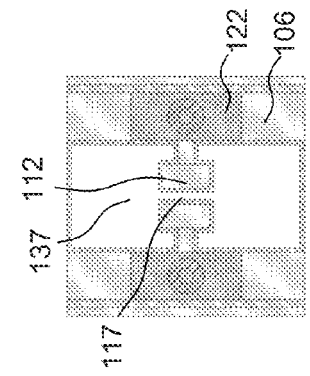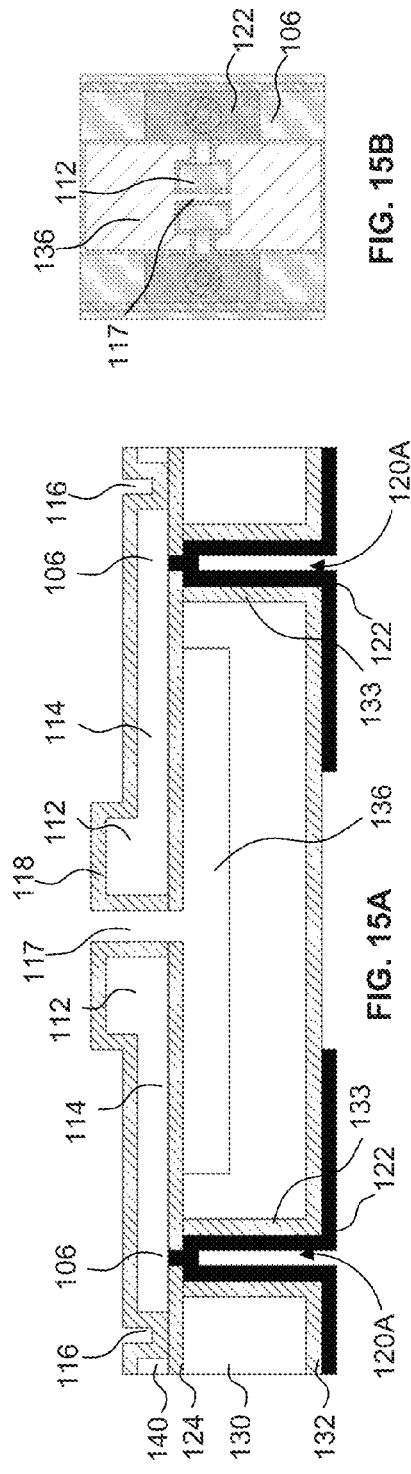

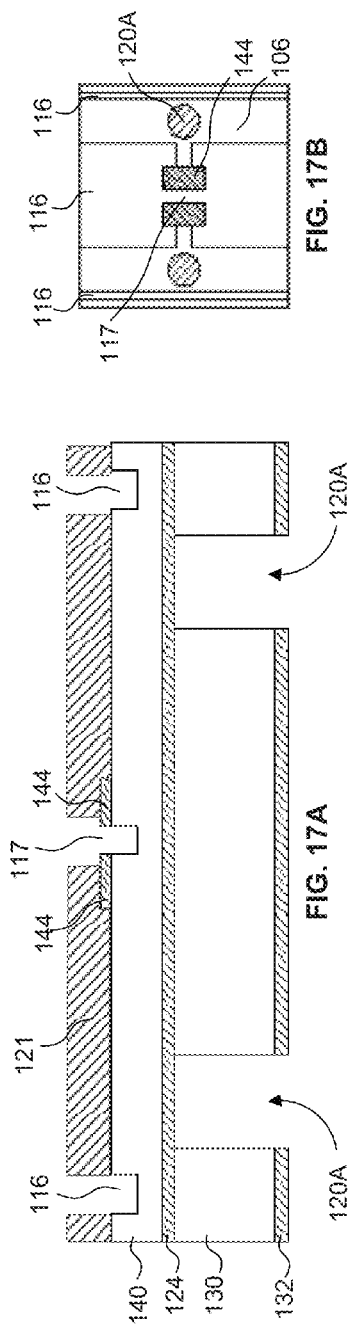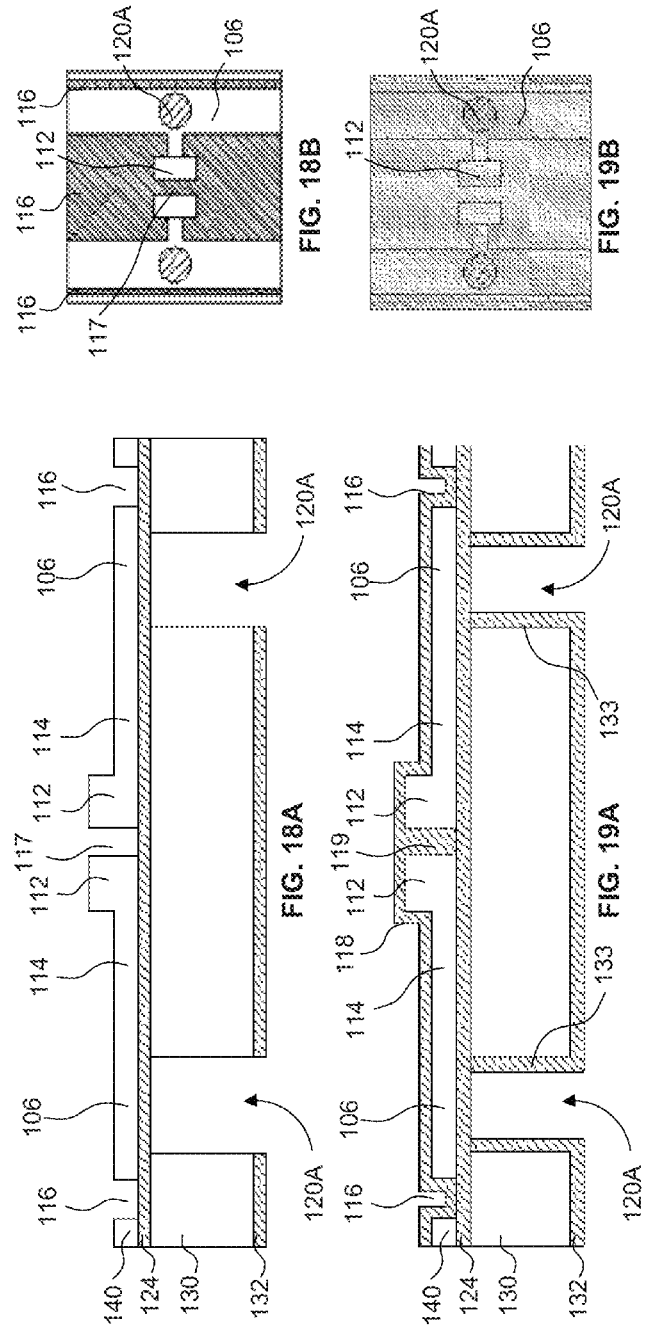

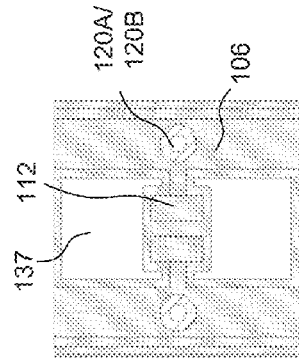
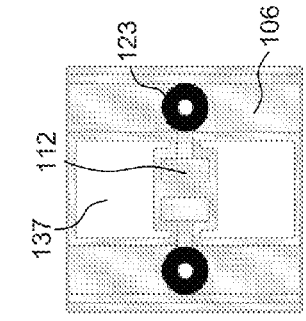
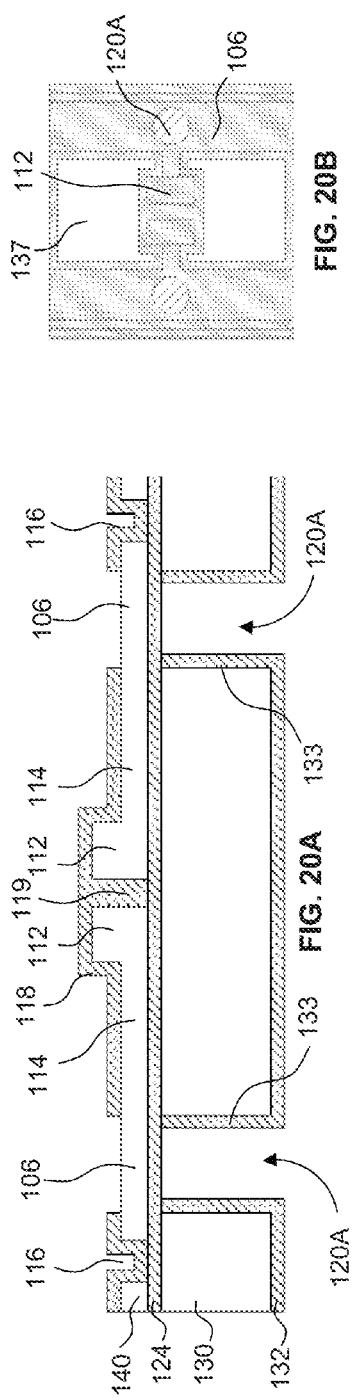
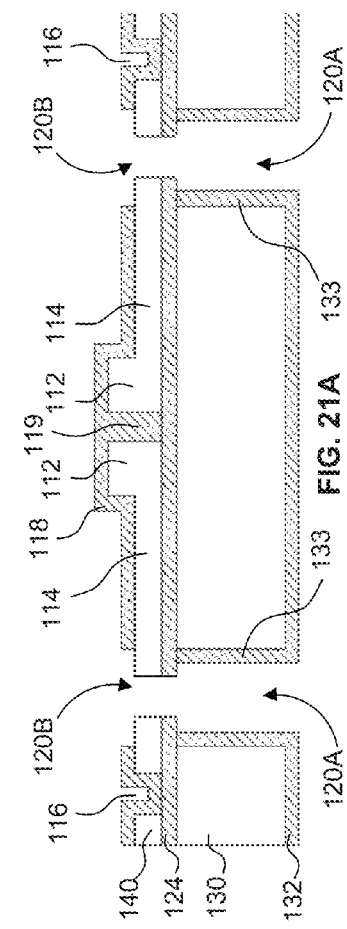
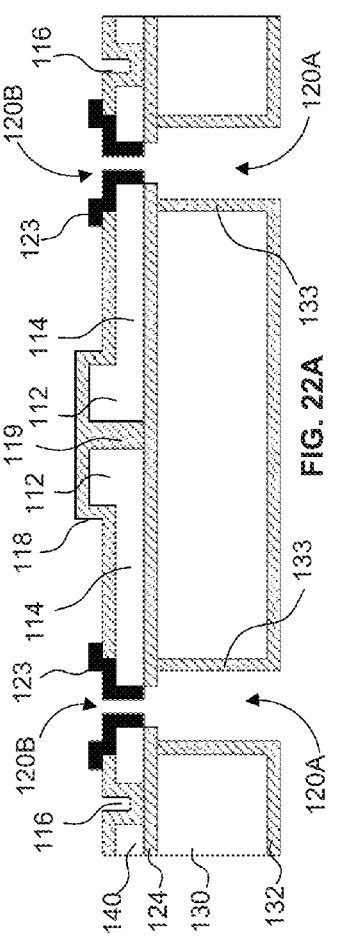
FIG. 20A  FIG. 20B
FIG. 21A  FIG. 21B
FIG. 22A  FIG. 22B

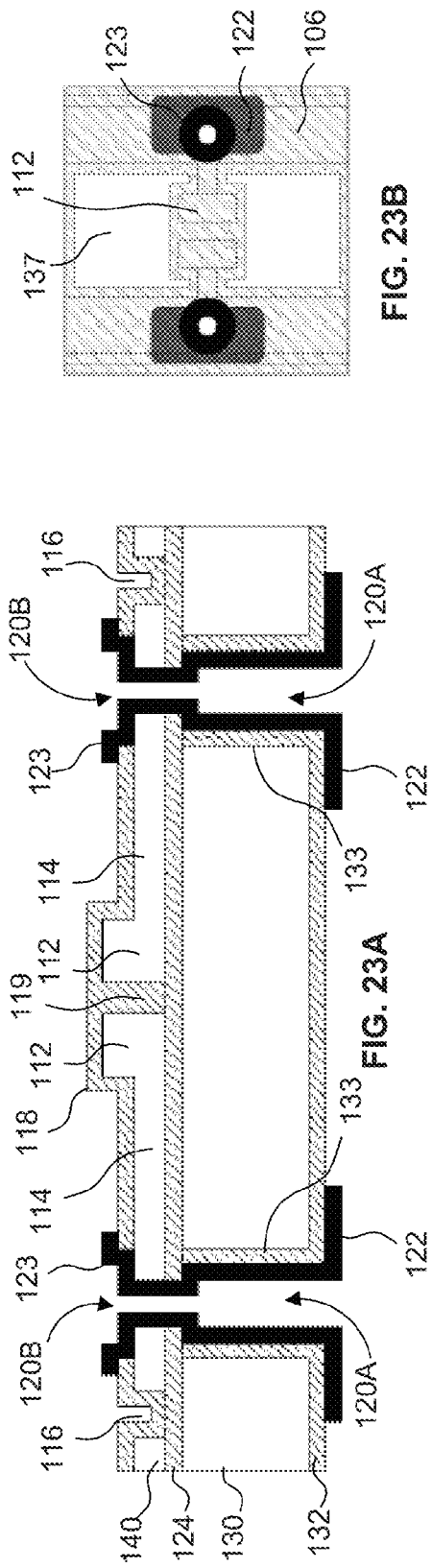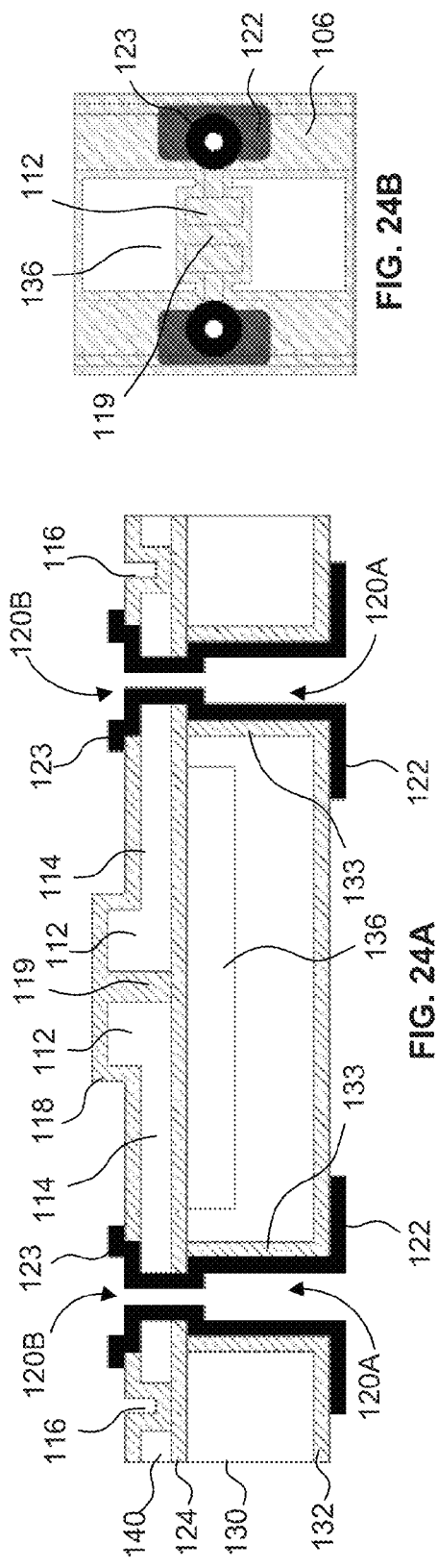

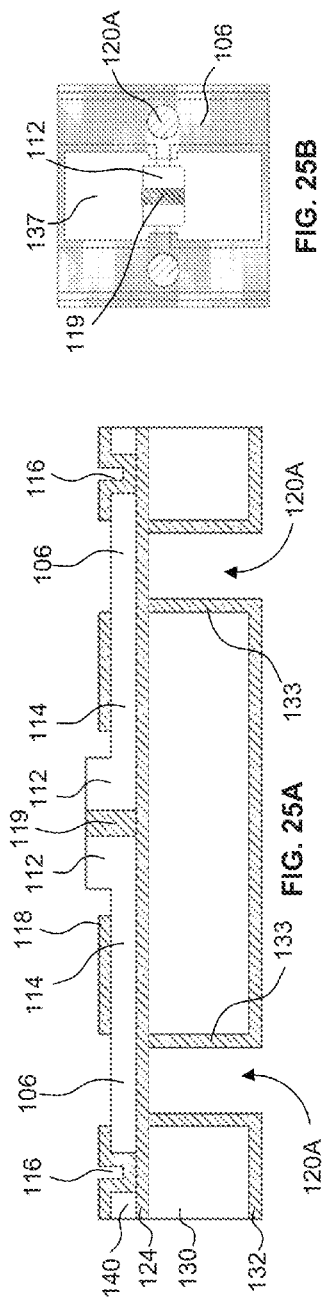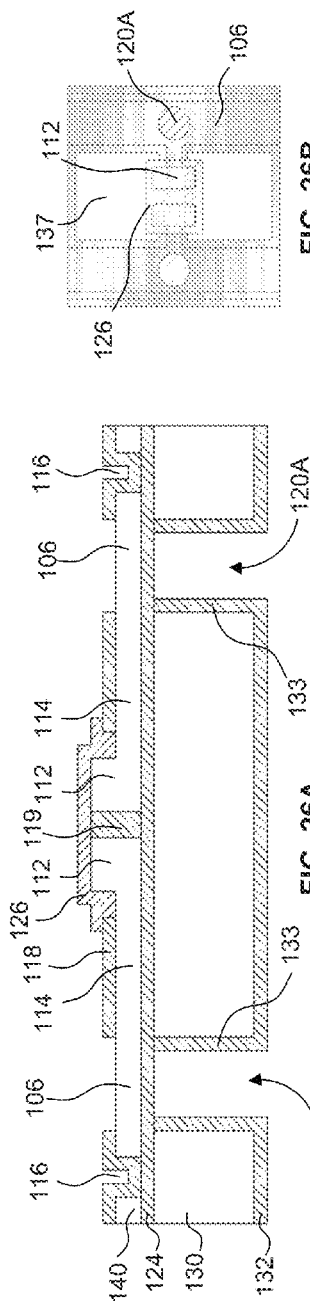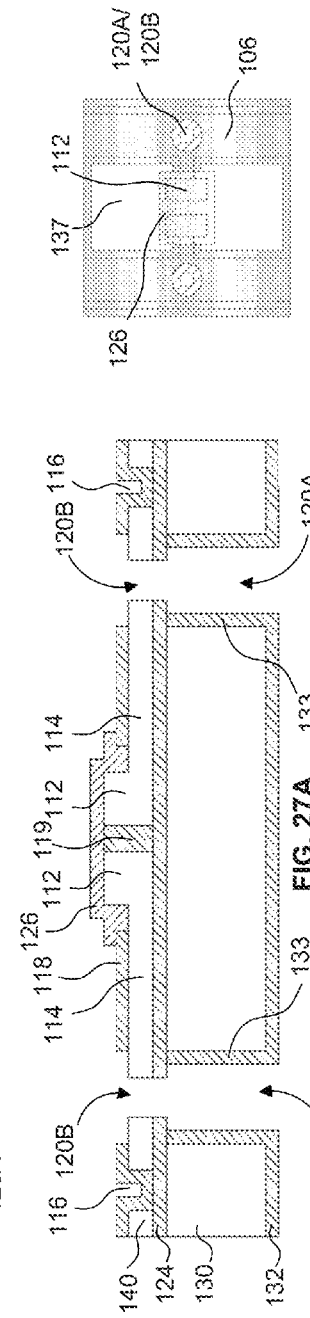

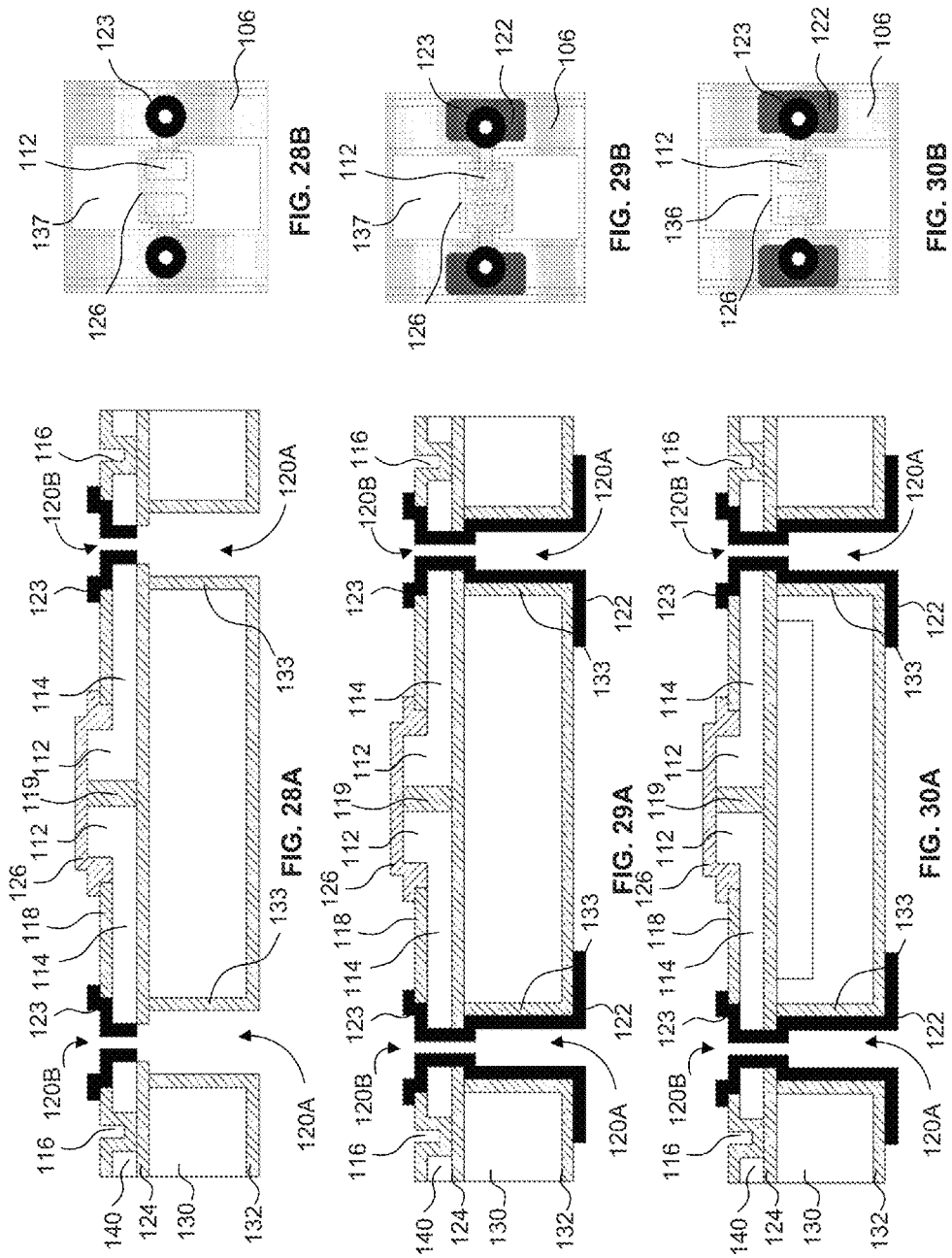

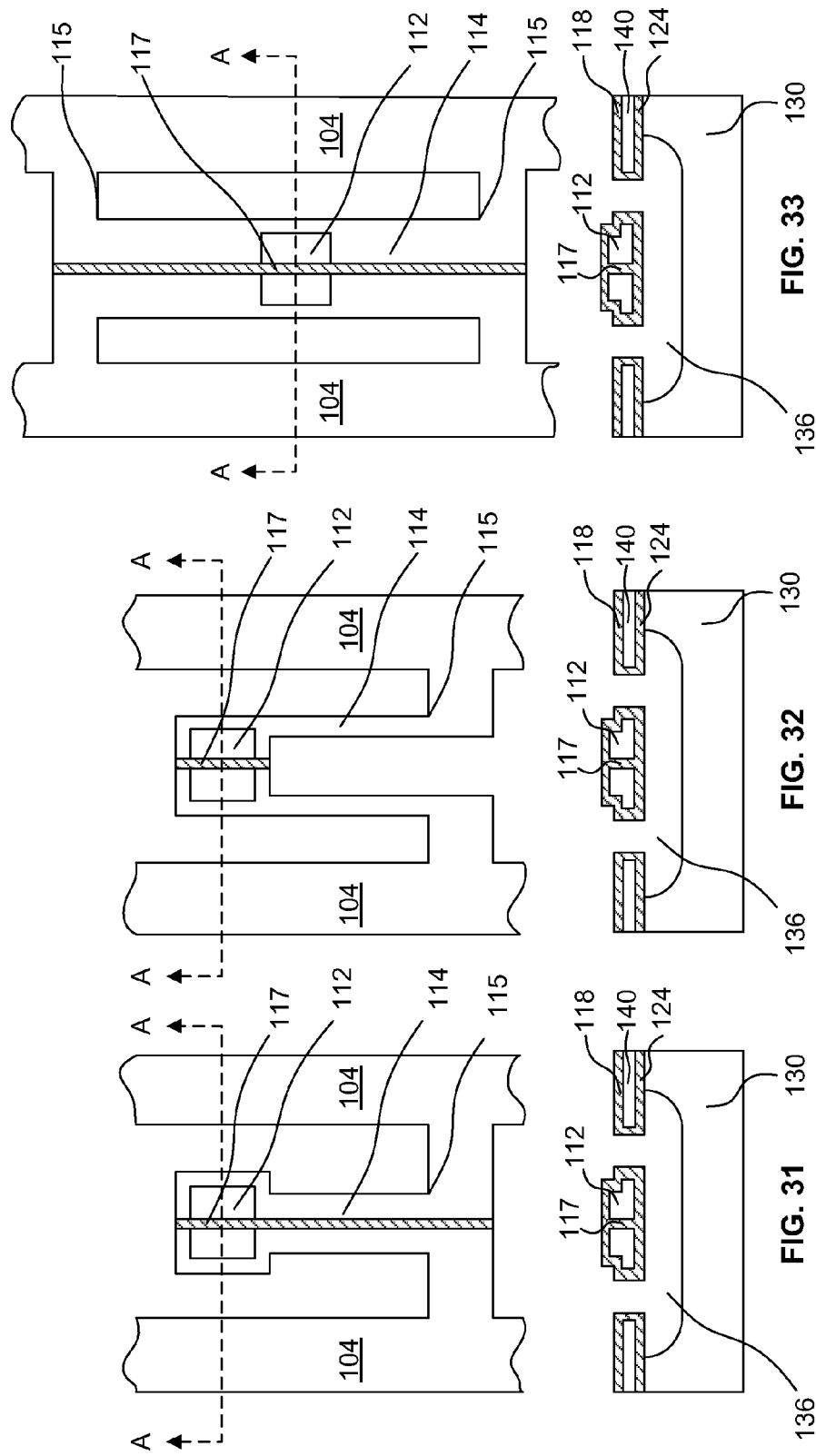

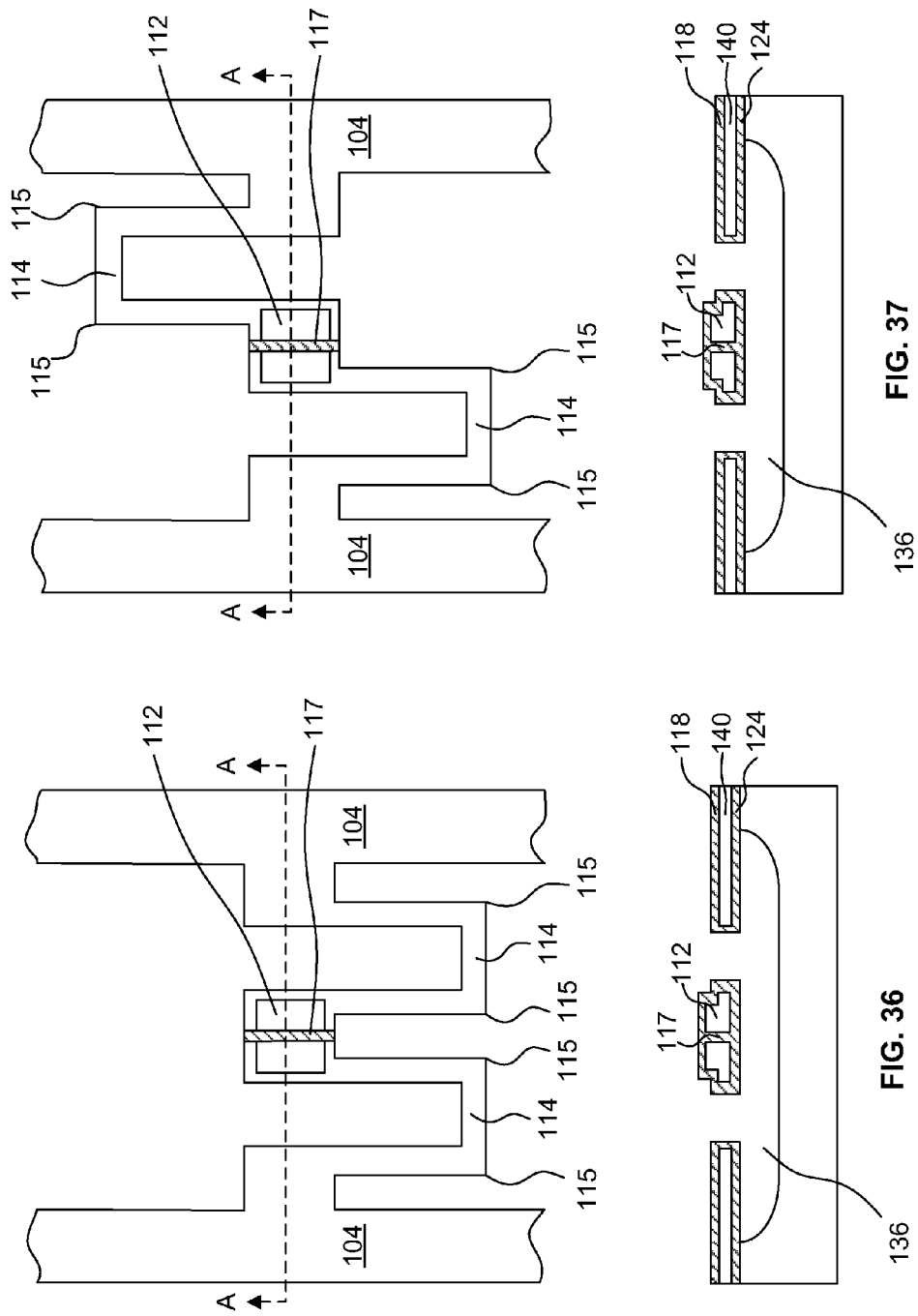

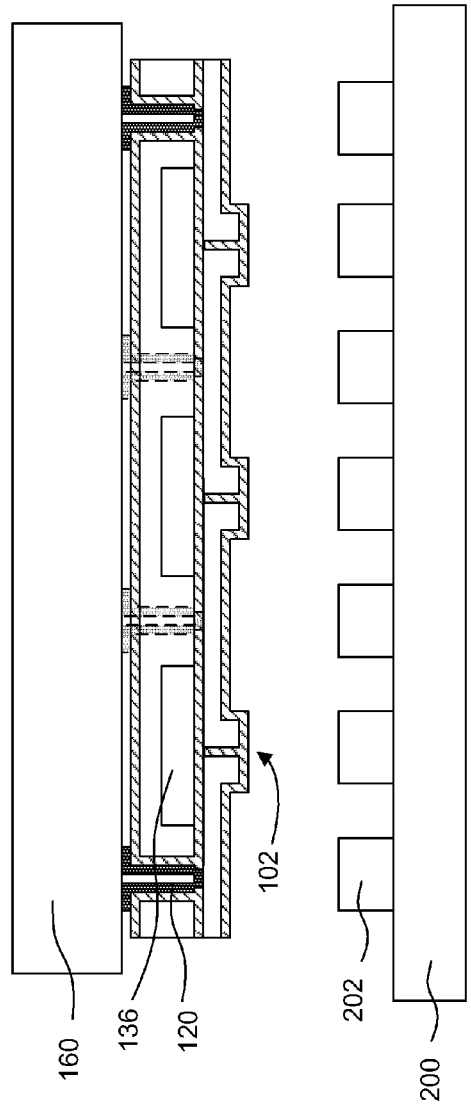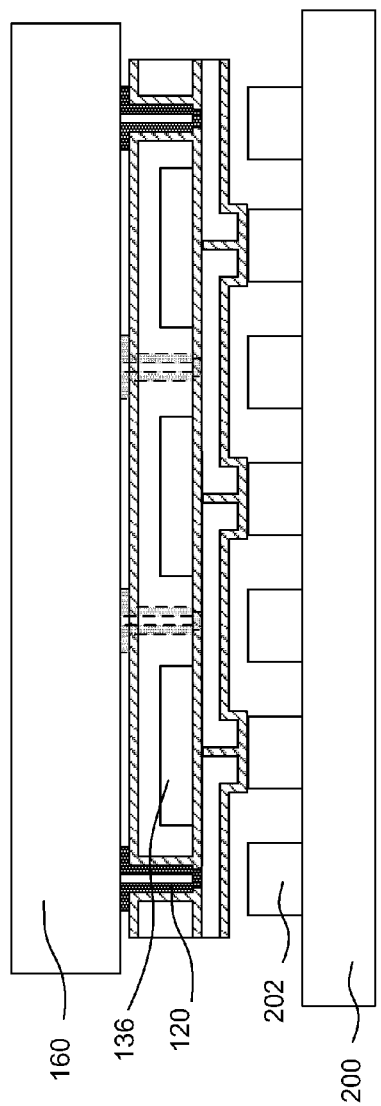

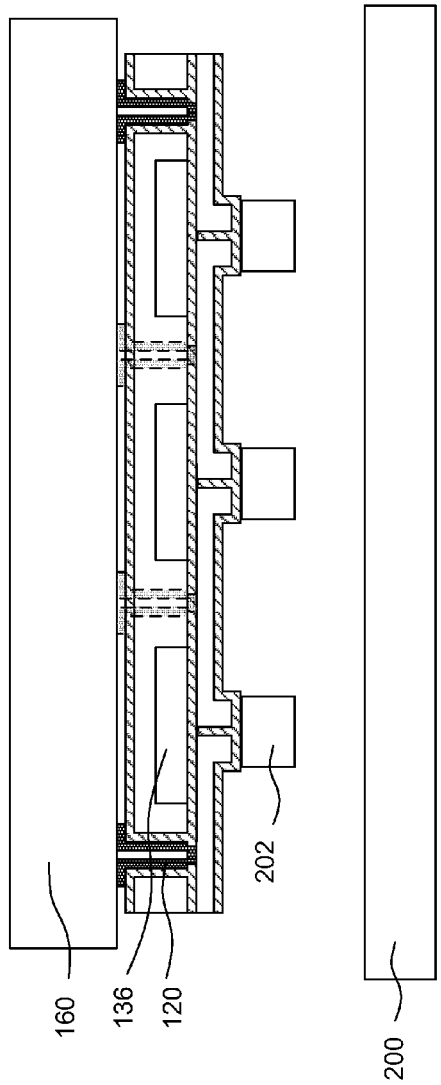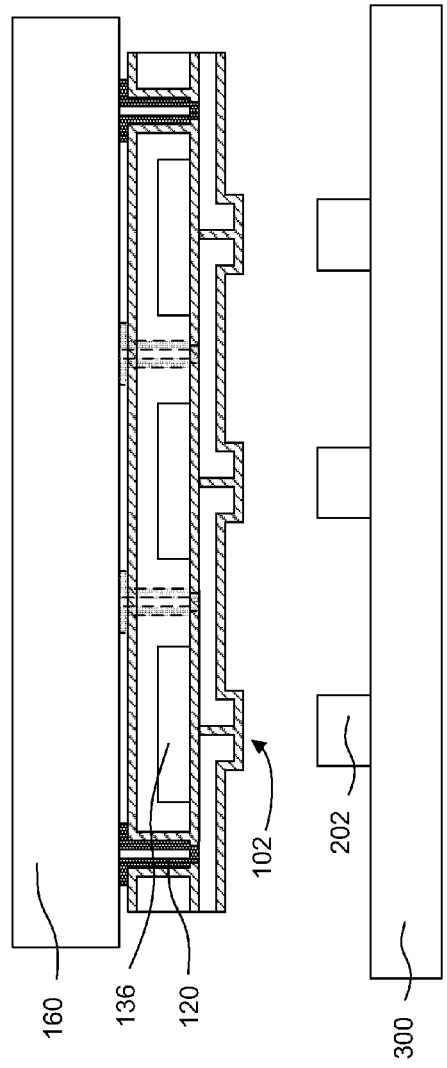

METHOD OF FORMING A COMPLIANT BIPOLAR MICRO DEVICE TRANSFER HEAD WITH SILICON ELECTRODES

BACKGROUND

1. Field

The present invention relates to micro devices. More particularly embodiments of the present invention relate to a compliant bipolar micro device transfer head and a method of transferring one or more micro devices to a receiving substrate.

2. Background Information

Integration and packaging issues are one of the main obstacles for the commercialization of micro devices such as radio frequency (RF) microelectromechanical systems (MEMS) microswitches, light-emitting diode (LED) display systems, and MEMS or quartz-based oscillators.

Traditional technologies for transferring of devices include transfer by wafer bonding from a transfer wafer to a receiving wafer. One such implementation is "direct printing" involving one bonding step of an array of devices from a transfer wafer to a receiving wafer, followed by removal of the transfer wafer. Another such implementation is "transfer printing" involving two bonding/de-bonding steps. In transfer printing a transfer wafer may pick up an array of devices from a donor wafer, and then bond the array of devices to a receiving wafer, followed by removal of the transfer wafer.

Some printing process variations have been developed where a device can be selectively bonded and de-bonded during the transfer process. In both traditional and variations of the direct printing and transfer printing technologies, the transfer wafer is de-bonded from a device after bonding the device to the receiving wafer. In addition, the entire transfer wafer with the array of devices is involved in the transfer process.

SUMMARY OF THE INVENTION

A compliant bipolar micro device transfer head and head array, and a method of transferring one or more micro devices to a receiving substrate are disclosed. For example, the receiving substrate may be, but is not limited to, a display substrate, a lighting substrate, a substrate with functional devices such as transistors or integrated circuits (ICs), or a substrate with metal redistribution lines.

In an embodiment, a compliant bipolar micro device transfer head array includes a base substrate and a patterned silicon layer over the base substrate. For example, the base substrate may be a (100) bulk silicon substrate. The patterned silicon layer includes a first silicon interconnect, a first array of silicon electrodes electrically connected with the silicon interconnect, a second silicon interconnect, and a second array of silicon electrodes electrically connected with the second silicon interconnect. Each silicon electrode in the first and second arrays of silicon electrodes includes an electrode lead and a mesa structure that protrudes above the first and second silicon interconnects. The first and second arrays of silicon electrodes are aligned as an array of bipolar silicon electrode pairs and electrically insulated from one another. The first and second silicon interconnects may be parallel to each other. Each silicon electrode is also deflectable into a cavity between the base substrate and the silicon electrode. For example, one or more cavities may be formed in the base substrate. In an embodiment, the first and second arrays of silicon electrodes are deflectable into the same cavity in the base substrate. In such an embodiment, the array of bipolar silicon electrode pairs is deflectable into the same cavity in the base substrate. The cavity may also wrap around an end of one, or both, of the first and second silicon electrodes. In an embodiment, each bipolar silicon electrode pair in the array of bipolar electrode pairs is deflectable into a separate cavity. A dielectric layer such as a silicon oxide, hafnium oxide, aluminum oxide, or tantalum oxide, covers a top surface of each mesa structure. A buried oxide layer may be formed between the patterned silicon layer and the base substrate.

In an embodiment, an array of bipolar silicon electrode pairs form an array of supported beams spanning between the silicon interconnect and the second silicon interconnect. For example, an array of oxide joints may be formed between the first and second arrays of silicon electrodes. The patterned silicon layer may be on and in direct contact with a buried oxide layer, with the oxide joints on and in direct contact with the buried oxide layer. The oxide joints may be parallel or perpendicular to the first and second arrays of silicon interconnects, and between the mesa structures of the first and second arrays of silicon electrodes. The supported beams may also include bends, for example, in the silicon electrode leads of the silicon electrodes. The array of oxide joints may separate the first and second arrays of silicon electrodes along a longitudinal length or a transverse width of the array of supported beams.

In an embodiment, an array of bipolar silicon electrode pairs form an array of cantilever beams spanning between the silicon interconnect and the second silicon interconnect. In an embodiment, each silicon electrode in the bipolar silicon electrode pairs is a separate cantilever beam, and an open space is between the mesa structures of the first and second arrays of silicon electrodes. The cantilever beams may include bends. In an embodiment, the mesa structures of the first and second arrays of silicon electrodes are not separated by an open space. For example, an array of oxide joints may be formed between first and second arrays of silicon electrodes for the array of cantilever beams. The patterned silicon layer may be on and in direct contact with a buried oxide layer, with the oxide joints on and in direct contact with the buried oxide layer. In an embodiment, the oxide joints separate the first and second arrays of silicon electrodes along a longitudinal length of the array of cantilever beams. In an embodiment, the oxide joints are parallel to the first and second silicon interconnects, and are between the mesa structures of the first and second arrays of silicon electrodes.

In an embodiment, a buried silicon oxide layer is between the patterned silicon layer and the base substrate. A first via extends through the base substrate and the buried silicon oxide layer from a backside of the base substrate to the patterned silicon layer and, and in electrical connection with the first silicon interconnect and the first array of silicon electrodes. A second via extends through the base substrate and the buried silicon oxide layer from a backside of the base substrate to the patterned silicon layer and, and in electrical connection with the second silicon interconnect and the second array of silicon electrodes. The vias may extend through the patterned silicon layer or terminate at a bottom surface of the patterned silicon layer.

The dielectric layer covering a top surface of each mesa structure in the array and the second array may be formed of a material such as silicon oxide, hafnium oxide, aluminum oxide, and tantalum oxide. In some embodiments, a first dielectric layer is laterally between the mesa structures of the array of silicon electrodes and the second array of silicon electrodes in a bipolar electrode configuration, and underneath the dielectric layer covering the top surface of each mesa structure in the array and the second array. The dielectric layer may have a higher dielectric constant or dielectric breakdown strength than the first dielectric layer.

In an embodiment, an method of forming a compliant bipolar micro device transfer head array includes etching a top silicon layer of a silicon-on-insulator stack to form an a first array of silicon electrodes electrically connected with a first silicon interconnect, and a second array of silicon electrodes aligned with the first array of silicon electrodes and electrically connected with a second silicon interconnect to form an array of bipolar silicon electrode pairs, with each silicon electrode in the first and second arrays of silicon electrodes including an electrode lead and a mesa structure that protrudes above the first and second silicon interconnects. A dielectric layer is then formed over the first and second arrays of silicon electrodes, and one or more cavities are etched into the base substrate directly underneath the first and second arrays of silicon electrodes such that each silicon electrode in the first and second arrays of silicon electrodes is deflectable into the one or more cavities. Etching of the one or more cavities may be accomplished, for example, with a fluorinated plasma of $SF_6$ or $XeF_2$. In an embodiment, a separate cavity is etched in the base substrate directly underneath each bipolar silicon electrode pair. In an embodiment, a single cavity is etched in the base substrate directly underneath the array of bipolar silicon electrode pairs. In an embodiment, the single cavity is etching in the base substrate so that it wraps around one, or both, of the first and second silicon interconnects.

Etching of the top silicon layer may expose a buried oxide layer. Formation of the dielectric layer may be accomplished with a variety of techniques. In some embodiments, the dielectric layer includes thermal oxidation of the array of silicon electrodes. In some embodiments, a patterned layer is formed over the buried oxide layer and the dielectric layer after forming the dielectric layer, and using the patterned layer the buried oxide layer is etched to expose a portion of the base substrate. The dielectric layer can be used as an etching mask when etching one or more cavities in the base substrate directly underneath the first and second arrays of silicon electrodes.

In an embodiment, an array of joint trenches are etched between the mesa structures of the first and second arrays of silicon electrodes simultaneously with etching the top silicon layer of the silicon-on-insulator stack to form the first and second arrays of silicon electrodes. The dielectric layer may also be formed within the array of joint trenches and in direct contact with the buried oxide layer simultaneously with forming the dielectric layer over the first and second arrays of silicon electrodes. For example, the dielectric layer may be formed by thermal oxidation of the first and second arrays of silicon electrodes. The dielectric layer may also completely fill the array of joint trenches with the dielectric layer to form an array of oxide joints between the first and second arrays of silicon electrodes.

A first backside via opening may be etched through the base substrate directly underneath the first silicon interconnect, and second backside via opening may be etched through the base substrate directly underneath the second silicon interconnect, and a passivation layer may be formed within the first and second backside via openings. In an embodiment, the passivation layer is formed by thermally oxidizing the base substrate within the first and second backside via openings simultaneously with thermally oxidizing array of first and second arrays of silicon electrodes to form the dielectric layer. A patterned conductive layer may be formed within the first and second via openings to make electrical contact with the first and second silicon interconnects, for example, by deposition through a shadow mask.

In an embodiment, the dielectric layer is etched to expose a portion of the first and second silicon interconnects simultaneously with etching through the buried oxide layer to expose the portion of the base substrate. A first topside via opening is then etched through the first exposed portion of the first silicon interconnect and the buried oxide layer, and a second topside via opening is etched through the second exposed portion of the second silicon interconnect and the buried oxide layer. A patterned conductive layer can then be formed within the first and second topside via openings to make electrical contact with the first and second silicon interconnects.

In an embodiment, the dielectric layer is etched to expose each of the mesa structures simultaneously with etching through the buried oxide layer to expose the portion of the base substrate. A second dielectric layer can then be formed over each of the mesa structures. In an embodiment, this may be accomplished by blanket deposition of the second dielectric layer followed by removal of a portion of the second dielectric layer. In some embodiments, blanket deposition may be accomplished by atomic layer deposition. In an embodiment, the dielectric layer may be additionally etched to expose a portion of the first and second silicon interconnects, followed by etching a first topside via opening through the exposed portion of the first silicon interconnect and the buried oxide layer, etching a second topside via opening through the exposed portion of the second silicon interconnect and the buried oxide layer, and forming a patterned conductive layer within the first and second topside via openings to make electrical contact with the silicon interconnect and second silicon interconnect. The second dielectric layer formed over each of the mesa structures and the conductive layer formed within the first and second topside via openings may also be used as an etching mask when etching the one or more cavities.

BRIEF DESCRIPTION OF THE DRAWINGS

FIG. 1B is a plan view illustration of a compliant bipolar micro device transfer head with a pair of single sided clamped cantilever beams and no joint in accordance with an embodiment of the invention.

FIG. 1C is a cross-sectional side view illustration taken along transverse line C-C of the compliant bipolar micro device transfer head illustrated in FIG. 1B in accordance with an embodiment of the invention.

FIG. 1D is a cross-sectional side view illustration taken along longitudinal line D-D of the compliant bipolar micro device transfer head illustrated in FIG. 1B in accordance with an embodiment of the invention.

FIGS. 2A-2B are combination plan view and combination cross-section side view illustrations taken along lines V-V, W-W, X-X, Y-Y, and Z-Z from FIG. 1A illustrating a compliant bipolar micro device transfer head including an open joint trench between the pair of silicon electrodes, and backside via openings in accordance with an embodiment of the invention.

FIGS. 3A-3B are combination plan view and combination cross-sectional side view illustrations of a compliant bipolar micro device transfer head including a double sided clamped supported beam and an oxide joint between and connecting the pair of silicon electrodes, and topside and backside via openings in accordance with an embodiment of the invention.

FIGS. 4A-4B are combination plan view and combination cross-sectional side view illustrations of a compliant bipolar micro device transfer head including a double sided clamped supported beam and deposited dielectric layer, an oxide joint 119 between and connecting the pair of silicon electrodes 110, and topside and backside via openings in accordance with an embodiment of the invention.

FIGS. 5A-15B illustrate a method of forming a compliant bipolar micro device transfer head including an open joint trench between the pair of silicon electrodes, and backside via openings in accordance with an embodiment of the invention.

FIGS. 17A-24B illustrate a method of forming a compliant bipolar micro device transfer head including a double sided clamped supported beam and an oxide joint between and connecting the pair of silicon electrodes, and topside and backside via openings in accordance with an embodiment of the invention.

FIGS. 25A-30B illustrate a method of forming a compliant bipolar micro device transfer head including a double sided clamped supported beam and a deposited dielectric layer, an oxide joint between and connecting the pair of silicon electrodes, and topside and backside via openings in accordance with an embodiment of the invention.

FIG. 31 is a plan view illustration and cross-sectional side view illustration taken along line A-A of a compliant bipolar micro device transfer head with cantilever beam and continuous joint in accordance with an embodiment of the invention.

FIG. 32 is a plan view illustration and cross-sectional side view illustration taken along line A-A of a compliant bipolar micro device transfer head with cantilever beam and mesa joint in accordance with an embodiment of the invention.

FIG. 33 is a plan view illustration and cross-sectional side view illustration taken along line A-A of a compliant bipolar micro device transfer head with double sided clamped beam and continuous joint in accordance with an embodiment of the invention.

FIG. 36 is a plan view illustration and cross-sectional side view illustration taken along line A-A of a compliant bipolar micro device transfer head with a double sided clamped beam including a pair of silicon electrodes with double bends and a mesa joint in accordance with an embodiment of the invention.

FIG. 37 is a plan view illustration and cross-sectional side view illustration taken along line A-A of a compliant bipolar micro device transfer head with a double sided clamped beam including a pair of silicon electrodes with double bends and a mesa joint in accordance with an embodiment of the invention.

FIG. 39 is a cross-sectional side view illustration of an array of compliant bipolar micro device transfer heads positioned over an array of micro devices on a carrier substrate in accordance with an embodiment of the invention.

FIG. 40 is a cross-sectional side view illustration of an array of compliant bipolar micro device transfer heads in contact with an array of micro devices in accordance with an embodiment of the invention.

FIG. 41 is a cross-sectional side view illustration of an array of compliant bipolar micro device transfer heads picking up an array of micro devices in accordance with an embodiment of the invention.

FIG. 42 is a cross-sectional side view illustration of an array of micro devices released onto a receiving substrate in accordance with an embodiment of the invention.

DETAILED DESCRIPTION OF THE INVENTION

Figure 1A:
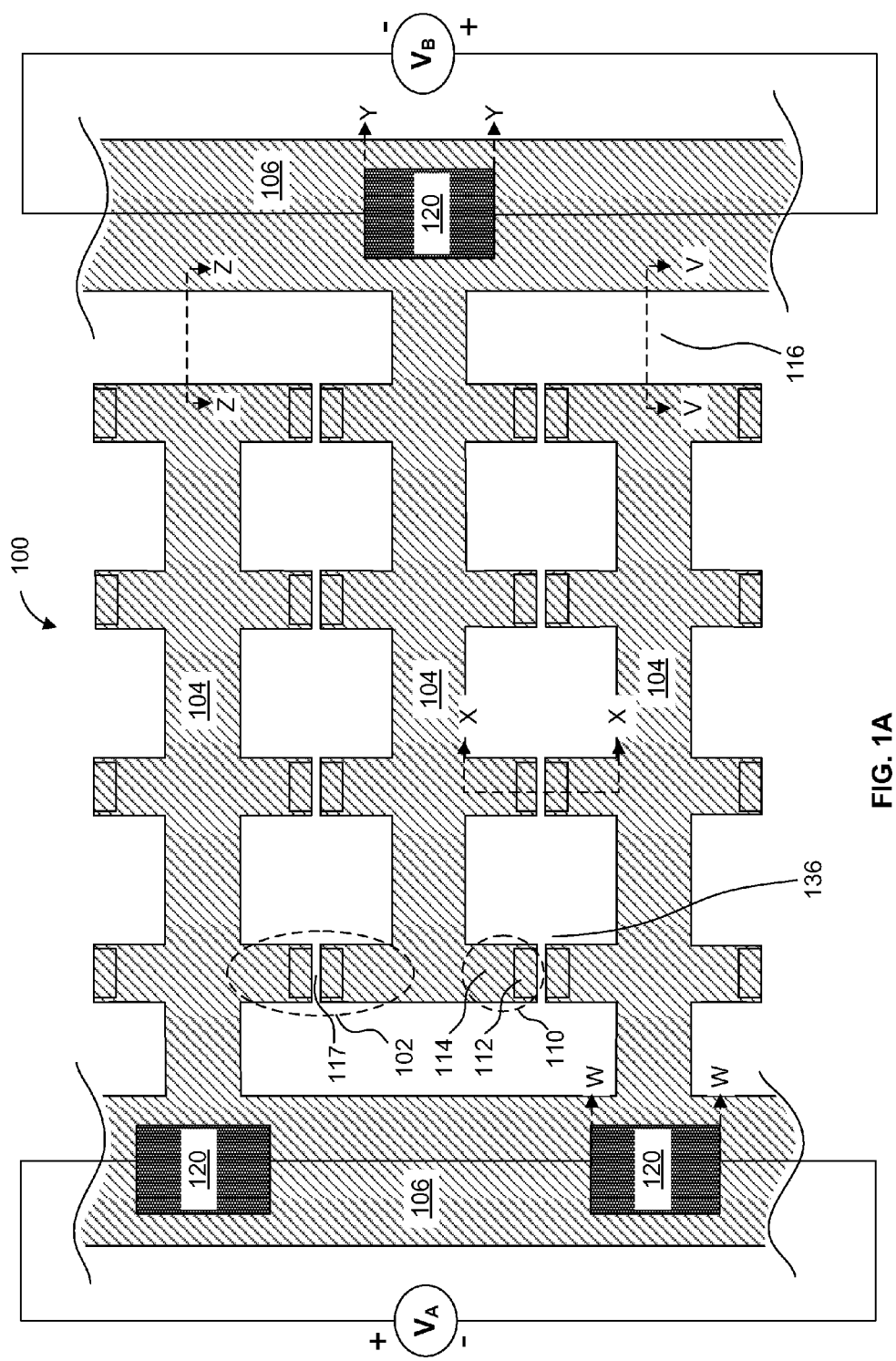
FIG. 1A is a plan view illustration of a compliant bipolar micro device transfer head array of single sided clamped cantilever beam pairs with no joint in accordance with an embodiment of the invention.

Embodiments of the present invention describe a compliant bipolar micro device transfer head and head array, and method of transferring a micro device and an array of micro devices to a receiving substrate. For example, the compliant bipolar micro device transfer head and head array may be used to transfer micro devices such as, but not limited to, diodes, LEDs, transistors, ICs, and MEMS from a carrier substrate to a receiving substrate such as, but is not limited to, a display substrate, a lighting substrate, a substrate with functional devices such as transistors or integrated circuits (ICs), or a substrate with metal redistribution lines.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiments.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "micro" device or "micro" LED structure as used herein may refer to the descriptive size of certain devices or structures in accordance with embodiments of the invention. As used herein, the terms "micro" devices or structures are meant to refer to the scale of 1 to 100 μm. However, it is to be appreciated that embodiments of the present invention are not necessarily so limited, and that certain aspects of the embodiments may be applicable to larger, and possibly smaller size scales.

In one aspect, without being limited to a particular theory, embodiments of the invention describe micro device transfer heads and head arrays which operate in accordance with principles of electrostatic grippers, using the attraction of opposite charges to pick up micro devices. In accordance with embodiments of the present invention, a pull-in voltage is applied to a micro device transfer head in order to generate a grip pressure on a micro device and pick up the micro device. For example, the transfer head may include a bipolar electrode configuration.

In one aspect, embodiments of the invention describe a compliant bipolar micro device transfer head and a method of transfer in which an array of the compliant bipolar micro device transfer heads enable improved contact with an array of micro devices as compared to an array of non-compliant transfer heads. The compliant bipolar micro device transfer heads include an array of bipolar silicon electrode pairs that are deflectable into one or more cavities between a base substrate and the bipolar silicon electrode pairs. In application, as an array of compliant bipolar micro device transfer heads are lowered onto an array of micro devices, the deflectable silicon electrodes associated with taller or contaminated micro devices may deflect more than silicon electrodes associated with shorter micro devices on a carrier substrate. In this manner, the compliant bipolar micro device transfer heads can compensate for variations in height of the micro devices. Compensating for height variations can result in reduced compressive forces applied to certain micro devices, leading to protection of the physical integrity of the micro devices and transfer head array. Compensating for height variations can also assist each compliant transfer head to make contact with each micro device, and ensure that each intended micro device is picked up. Without the compliant nature of the micro device transfer heads an irregular micro device height or a particle on a top surface of a single micro device could prevent the remainder of the transfer heads from making contact with the remainder of the micro devices in the array. As a result, an air gap could be formed between those transfer heads and micro devices. With such an air gap, it is possible that the target applied voltage would not create a sufficient grip pressure to overcome the air gap, resulting in an incomplete pick-up process.

In another aspect, embodiments of the invention describe a manner of forming an array of compliant bipolar micro device transfer heads from a commercially available silicon-on-insulator (SOI) substrate including a base substrate, buried oxide layer, and a top silicon layer. In such an embodiment, a silicon interconnect and an array of electrodes are formed from the top silicon layer of the SOI substrate. In an embodiment, a bipolar electrostatic transfer head includes a pair of silicon electrodes, where each silicon electrode includes a mesa structure and an electrode lead. The mesa structures for the pair of silicon electrodes protrude above their respective silicon interconnects to provide a localized contact point to pick up a specific micro device during a pick up operation. In this manner, it is not necessary to form patterned metal electrodes. It has been observed that when patterning of metal electrodes and electrode leads using a negative photoresist, for example, it can be difficult to control exposure of the photoresist at different depths (e.g. along both a top surface and down sidewalls of a mesa structure). Peeling of the patterned metal layers has also been observed during photoresist removal, potentially affecting operability of the transfer heads. In accordance with embodiments of the present invention, it is not required to form a patterned metal electrode over a mesa structure. Instead, the protruding profile of the mesa structure is formed by patterning the silicon electrode to include a raised portion corresponding to the mesa structure which protrudes away from the base substrate and above the silicon interconnect.

Silicon electrodes prepared in accordance with embodiments of the invention may include integrally formed mesa structures which are substantially taller compared to non-integrally formed mesa structures with patterned metal electrodes. Photolithography can limit patterned metal electrode structures to heights of 5-10 μm, whereas silicon electrode mesa structures can be up to 20-30 μm or taller. The mesa structure height for a silicon electrode structure is limited by the etch aspect ratio and the electrode gap (e.g. the trench between mesa structures for a pair of bipolar silicon electrodes). In an embodiment, aspect ratios of mesa structure height to trench width for silicon electrode mesa structures can range from 10-20:1. For example, silicon electrode mesa structures in a bipolar electrode configuration can be 20 μm tall separated by a 2 μm trench gap between the mesa structures. Taller electrode structures may also afford larger clearance for contaminant particles and reduce the effects of stray filed on un-targeted micro devices. When compared to metalized mesa structures, silicon electrodes with integrally formed mesa structures can be more robust to surface contamination and errors in planar alignment of the micro device transfer head in relation to the micro device carrier substrate.

In another aspect, embodiments of the invention describe a manner of forming an array of micro device transfer heads from a commercially available silicon-on-insulator (SOI) substrate which allows for a processing sequence with minimal processing steps. The processing sequence does not require metal deposition and patterning steps to form metal electrodes, which relieves thermal processing constraints and allows for the formation of dielectric and passivation layers by high temperature thermal oxidation resulting in reduced deposition and patterning operations. Processing sequences in accordance with embodiments of the invention may incorporate simultaneous etching or oxidation operations of different features, reducing the number of masks required during processing.

In another aspect, embodiments of the invention describe a transfer head and transfer head array including vias extending through the base substrate from a backside of the base substrate to the patterned silicon layer for connecting the electrodes with working circuitry of a transfer head assembly. The processing sequence in accordance with embodiments of the invention also enables passivation of the vias extending through the base substrate with high temperature thermal oxide growth.

In yet another aspect, embodiments of the invention describe a manner for mass transfer of an array of pre-fabricated micro devices with an array of compliant transfer heads.

For example, the pre-fabricated micro devices may have a specific functionality such as, but not limited to, a LED for light-emission, silicon IC for logic and memory, and gallium arsenide (GaAs) circuits for radio frequency (RF) communications. In some embodiments, arrays of micro LED devices which are poised for pick up are described as having a 10 μm by 10 μm pitch, or 5 μm by 5 μm pitch. At these densities a 6 inch substrate, for example, can accommodate approximately 165 million micro LED devices with a 10 μm by 10 μm pitch, or approximately 660 million micro LED devices with a 5 μm by 5 μm pitch. A transfer tool including an array of compliant transfer heads matching an integer multiple of the pitch of the corresponding array of micro LED devices can be used to pick up and transfer the array of micro LED devices to a receiving substrate. In this manner, it is possible to integrate and assemble micro LED devices into heterogeneously integrated systems, including substrates of any size ranging from micro displays to large area displays, and at high transfer rates. For example, a 1 cm by 1 cm array of micro device transfer heads can pick up and transfer more than 100,000 micro devices, with larger arrays of micro device transfer heads being capable of transferring more micro devices.

Referring now to FIG. 1A, a plan view illustration is provided for a portion of a bipolar micro device transfer head array of single sided clamped cantilever beam pairs with no joints, and includes views at different depths. In the particular embodiment illustrated, the shaded area illustrates an arrangement of silicon electrodes and silicon interconnects as viewed from the top surface of the compliant bipolar micro device transfer head array. The darker shading illustrates a backside via connection as viewed from the backside surface of the compliant bipolar micro device transfer head array. In this manner, the plan view illustration provides detail regarding structures which have been formed from both sides of the SOI wafer.

As illustrated, the compliant bipolar micro device transfer head array 100 includes an array of compliant bipolar transfer heads 102 connected to an arrangement of silicon trace interconnects 104, and bus interconnects 106. As illustrated, bus interconnects 106 may be formed around a periphery or outside a working area of the compliant bipolar transfer head array including the array of compliant transfer heads 102. In an embodiment, each compliant bipolar transfer head 102 includes a pair of silicon electrodes 110, with each silicon electrode 110 including a mesa structure 112 and an electrode lead 114 connected to a silicon interconnect 104. As illustrated, each compliant transfer head 102 is in the form of a pair of single sided clamped cantilever beams clamped at opposite sides to silicon trace interconnects 104. The pair of silicon electrodes 110 for each compliant bipolar transfer head 102 of the embodiment illustrated in FIG. 1A are not joined, as illustrated by an open joint trench 117 between the pair of mesa structures 112. In the embodiment illustrated, the array of mesa structure 112 pairs in the compliant bipolar micro device transfer head array 100 are arranged with approximately the same pitch as the micro devices to be picked up, for example, 10 μm by 10 μm, or 5 μm by 5 μm.

In an embodiment, a plurality of vias 120 are formed through the backside of the base substrate to the patterned silicon layer to make contact with interconnects 106 in order to electrically connect the silicon electrodes 110 with working circuitry of a transfer head assembly. In the embodiment illustrated in FIG. 1A, the interconnect 106 on the left side of the illustration may be connected to a first voltage source $V_A$, and the interconnect 106 on the right side of the illustration may be connected to a second voltage source $V_B$. Where each transfer head 102 is operable as a bipolar transfer head, voltage sources $V_A$ and $V_B$ may simultaneously apply opposite voltages so that each of the silicon electrodes 110 in a respective transfer head 102 has an opposite voltage.

FIG. 1B is a plan view illustration of a compliant bipolar micro device transfer head with a pair of single sided clamped cantilever beams and no joint in accordance with an embodiment of the invention. As illustrated, the opposing silicon electrodes 110 are clamped at opposite sides to silicon trace interconnects 104. For clarity purposes, only a single bipolar transfer head 102 is illustrated in FIG. 1B as spanning between two silicon trance interconnects 104, though an array of bipolar transfer heads may span between the silicon interconnects 104 in accordance with embodiments of the invention. The pair of silicon electrodes 110 for each compliant bipolar transfer head 102 are not joined, as illustrated by the open joint trench 117 between the pair of mesa structures 112. In the embodiment illustrated, the joint trench 117 is parallel to the silicon interconnects 104. FIG. 1C is a cross-sectional side view illustration taken along transverse line C-C of the compliant bipolar micro device transfer head illustrated in FIG. 1B in accordance with an embodiment of the invention. In the embodiment illustrated in FIG. 1C, each silicon electrode 110 in a bipolar electrode configuration extends from a separate silicon interconnect 104. FIG. 1D is a cross-sectional side view illustration taken along longitudinal line D-D of the compliant bipolar micro device transfer head illustrated in FIG. 1B in accordance with an embodiment of the invention. As illustrated in FIGS. 1C-1D, both the silicon electrode mesa structures 112 and leads 114 extend over and are deflectable into a cavity 136 between the base substrate 130 and the silicon electrode 110. In an embodiment, a single cavity 136 is formed underneath an array of bipolar silicon electrodes 110 and between two separate silicon interconnects 104. Referring again to FIG. 1A, a single or multiple separate cavities 136 can be formed between arrays of silicon interconnects 104. In an embodiment, cavities 136 are the same cavity. For example, cavity 136 may wrap around silicon interconnect 104 and underneath the array of silicon electrodes 110. Trenches 116 may also be formed in the patterned silicon layer defining the silicon electrodes 110 and silicon interconnects 104, 106 as described in more detail in the following description. A trench 116 may also be formed in the patterned silicon layer at an end of a silicon interconnect 104 if a cavity 136 does not wrap around the end of the silicon interconnect 104.

Referring now to FIGS. 2A-2B, FIGS. 3A-3B and FIGS. 4A-4B various different compliant bipolar transfer head array configurations in accordance with embodiments of the invention are illustrated side-by-side. It is to be understood that while the following variations are separately illustrated and described, the variations are not necessarily incompatible with one another, and that the variations may be combined in any suitable manner in one or more embodiment.

FIGS. 2A-2B are a combination plan view illustration and combination cross-sectional side view illustration taken along lines V-V, W-W, X-X, Y-Y, and Z-Z from FIG. 1A in accordance with an embodiment of the invention. FIGS. 3A-3B and FIGS. 4A-4B are combination plan view illustrations and combination cross-sectional side view illustrations prepared similarly as those in FIGS. 2A-2B. The combination views are not representations of the precise relative locations for all of the different features illustrated, rather the combination views combine specific features at different locations previously identified in FIG. 1A in order to more easily represent the particular variations in processing sequences. For example, while the combination cross-sectional side view illustrations show one via 120 corresponding to one silicon electrode 110, it is clear from FIG. 1A that one via 120 may be electrically connected with a plurality of silicon electrodes 110 along one or more interconnects 104. As illustrated, lines W-W and Y-Y are along vias 120. As illustrated, lines V-V and Z-Z are along one or more trenches 116 defining the silicon electrodes 110 and silicon interconnects 104, 106. As illustrated, line X-X is across a bipolar transfer head including a pair of silicon electrodes 110. Referring again to FIG. 1A, one or more cavities 136 may be formed around and beneath all silicon electrodes 110, and between interconnects 104, 106.

Referring again to FIGS. 2A-2B, a silicon electrode 110 includes a mesa structure 112 and an electrode lead 114, where the mesa structure 112 is an elevated portion of the silicon electrode 110. A dielectric layer 118 may cover a top surface of the pair of silicon electrodes 110. Dielectric layer 118 may also cover a side surface of the mesa structures 112 laterally between the pair of mesa structure 112 for the pair of silicon electrodes 110 in a bipolar transfer head 102. In the embodiment illustrated, each cantilever beam compliant transfer head 102 is separated by an open space in joint trench 117, and each silicon electrode 110 is separately deflectable into cavity 136. A via opening 120A may extend through the base substrate 130 from a backside of the base substrate to the patterned silicon layer 140 where interconnect 106 is located. In the particular embodiment illustrated in FIGS. 2A-2B, the via opening 120A extends through a buried oxide layer 124 and terminates at a bottom surface of the patterned silicon layer 140 where interconnect 106 is located. A passivation layer 132 is formed on the backside of the base substrate 130, and a passivation layer 133 is formed on side surfaces within the via opening 120A. Where base substrate is formed of silicon, the passivation layers 132, 133 insulate electrical shorting between the vias 120. The buried oxide layer 124 also insulates electrical shorting between the silicon electrodes 110, and interconnects 104, 106.

The vias 120 illustrated in FIG. 2A-2B extend through the base substrate 130 from a backside of the base substrate to a patterned silicon layer 140. In an embodiment, vias 120 contact one or more bus interconnects 106 in the patterned silicon layer 140. In other embodiments, vias 120 may contact other features or interconnects in the patterned silicon layer 140. Via 120 along line W-W may be electrically connected to a first interconnect 106 which is connected to a first voltage source $V_A$, and via 120 along line Y-Y may be electrically connected to a second interconnect 106 which is connected to a second voltage source $V_B$. In the particular embodiment illustrated, via openings 120A extend through a buried oxide layer 124 and terminate at a bottom surface of an interconnect 106. A passivation layer 132 is formed on the backside of the base substrate 130 and on side surfaces within the via openings 120A. A conductive layer 122 is formed on the passivation layer 133 and is in electrical contact with the bottom surface of an interconnect 106. In the particular embodiment illustrated, the conductive layers 122 do not completely fill the via openings 120A, and the conductive layers 122 are physically and electrically separated in order to prevent shorting between vias 120 connected to different voltage sources $V_A$, $V_B$. In an embodiment, vias 120 which are electrically connected to the same voltage source may or may not be physically and electrically connected. For example, a conductive layer 122 may span across both vias 120 on the left side of FIG. 1A, and also be electrically and physically separated from the via 120 taken along line Y-Y on the right side of FIG. 1A. In an embodiment, the structure illustrated in FIGS. 2A-2B is formed using a total of six masks.

FIGS. 3A-3B are combination plan view and combination cross-sectional side view illustrations of a compliant bipolar micro device transfer head including a double sided clamped supported beam and an oxide joint 119 between and connecting the pair of silicon electrodes 110, and topside and backside via openings in accordance with an embodiment of the invention. It is to be appreciated, that while an oxide joint 119 and topside and backside via openings are shown together in FIGS. 3A-3B, that embodiments of the invention are not so limited, and do not require an oxide joint 119 together with top side and backside via openings. As illustrated, in one embodiment the oxide joint 119 is formed between and connects the mesa structures 112 for the pair of silicon electrodes 110, and the oxide joint 119 is on and in direct contact with the buried oxide layer 140. Since the oxide joint 119 connects the silicon electrodes 110, the bipolar electrode assembly illustrated in FIGS. 3A-3B is characterized as a supported beam structure spanning between silicon interconnects. As illustrated, in one embodiment topside via opening 120B may be formed over the backside via opening 120A to form via 120. As will become more apparent in the following description, the topside via opening 120B may be formed in order make electrical contact with the silicon interconnects 106 and to form an opening through the buried oxide layer 124 without the lithographic challenges associated with not adversely affecting the passivation layer 133 along the sidewalls of via openings 120A. A conductive layer 123 can optionally be formed over the exposed top surface of the silicon interconnects 106 and within an interior side surface of the silicon interconnects 106. In this manner, partially forming conductive layer 123 over the top surface of the silicon interconnect 106 can provide greater surface area for ohmic contact with the silicon interconnects 106. Due to the closer proximity of the silicon interconnect 106 to the top surface of the SOI structure than the backside surface of the SOI structure, in accordance with some embodiments, it may be more efficient to form conductive layer 123 within the interior side surface of interconnect 106 from above the top surface of the SOI structure as opposed to from the back surface of the SOI structure. Conductive layer 123 may be formed from the same or different material from conductive layer 122. Conductive layers 122, 123 may form a continuous conductive layer along the via 120 side surfaces. In an embodiment, the structure illustrated in FIGS. 3A-3B is formed using a total of seven masks.

FIGS. 4A-4B are combination plan view and combination cross-sectional side view illustrations of a compliant bipolar micro device transfer head including a double sided clamped supported beam and a deposited dielectric layer 126, an oxide joint 119 between and connecting the pair of silicon electrodes 110, and topside and backside via openings in accordance with an embodiment of the invention. It is to be appreciated, that while a deposited dielectric layer 126, an oxide joint 119, and topside and backside via openings are shown together in FIGS. 4A-4B, that embodiments of the invention are not so limited, and do not require a deposited dielectric layer 126 together with an oxide joint 119, and top side and backside via openings. As illustrated, in one embodiment, dielectric layer 118 may be partially or completely removed. In the particular embodiment illustrated in FIGS. 4A-4B, the dielectric layer 118 is removed from over the mesa structures 112. A second dielectric layer 126 is formed over the top surface of mesa structures 112 and over the remaining topography of the transfer head array, which may include portions of dielectric layer 118. Dielectric layer 126 may also cover any of the oxide joint 119, topside via openings 120B and corresponding conductive layers 123, and may partially or completely fill the topside via openings 120B within the silicon interconnects 106. In an embodiment, dielectric layer 126 has a higher dielectric constant and/or dielectric breakdown strength than dielectric layer 118. In an embodiment, dielectric layer 118 is thermally grown $SiO_2$, and dielectric layer 126 is atomic layer deposition (ALD) $SiO_2$, $Al_2O_3$, $Ta_2O_5$, or $RuO_2$. It is to be appreciated, that while FIGS. 4A-4B are illustrated as a variation of FIGS. 3A-3B, that the feature of a dielectric layer 126 can be combined with the embodiments illustrated in FIGS. 2A-2B. In an embodiment, the structure illustrated in FIGS. 4A-4B is formed using a total of eight masks.

FIGS. 5A-15B illustrate a method of forming a compliant bipolar micro device transfer head including an open joint trench between a pair of silicon electrodes, and backside via openings in accordance with an embodiment of the invention. Initially, the processing sequence may begin with a commercially available SOI substrate as illustrated in FIGS. 5A-5B. The SOI substrate may include base substrate 130, top silicon layer 140, a buried oxide layer 124 between the base substrate and the top silicon layer, and backside passivation layer 132. In an embodiment, base substrate is a (100) silicon handle wafer having a thickness of 500 μm+/−50 μm, buried oxide layer 124 is 1 μm+/−0.1 μm thick, and top silicon layer is 7-20 μm+/−0.5 μm thick. The top silicon layer may also be doped to improve conductivity. For example, a phosphorous dopant concentration of approximately $10^{17}$ $cm^{-3}$ yields a resistivity of less than 0.1 ohm-centimeter. In an embodiment, the backside passivation layer 132 is a thermal oxide having a thickness up to approximately 2 μm thick, which is the approximate upper limit for thermal oxidation of silicon.

A mask layer 142 may then be formed over the top silicon layer 140, as illustrated in FIGS. 6A-6B. Mask layer 142 may be deposited, or alternatively thermally grown from the top silicon layer 140. In an embodiment, mask layer 142 is a thermally growth $SiO_2$ layer having a thickness of approximately 0.1 μm. In an embodiment, where mask layer 142 is thermally growth $SiO_2$, the mask layer 142 has a thickness which is significantly less than the thickness of buried oxide ($SiO_2$) layer 124 in order to maintain structural stability for the partially patterned SOI structure during removal of the patterned mask layer.

Referring to FIGS. 7A-7B, the mask layer 142 is then patterned to form an array of islands 144 which will correspond to the mesa structures of the silicon electrodes. In an embodiment, mask layer is a thermally grown $SiO_2$ layer, and islands 144 are formed by applying a positive photoresist, exposing, and removing undeveloped areas of the photoresist with a potassium hydroxide (KOH) developer solution. The mask layer 142 is then dry etched to form islands 144 using a suitable technique such as ion milling, plasma etching, reactive ion etching (RIE), or reactive ion beam etching (RIBE), electron cyclotron resonance (ECR), or inductively coupled plasma (ICP), stopping on the silicon layer 140. If a high degree of anisotropic etching is not required, a dry plasma etching technique with a plasma etchant such as $CF_4$, $SF_6$ or $NF_3$ may be used. The patterned photoresist is then removed by $O_2$ ashing followed by piranha etch resulting in the structure illustrated in FIGS. 7A-7B.

In an embodiment, backside via openings 120A are then formed in the SOI substrate. Initially, as illustrated in FIGS. 8A-8B, the backside via openings are formed through the backside passivation layer 132 and base substrate 130, stopping on the buried oxide layer 124. In an embodiment, the backside via openings 120A illustrated in FIGS. 8A-8B are formed by applying a patterned positive photoresist on the backside passivation layer 132, followed by etching of the exposed passivation layer 132 and dry reactive ion etching (DRIE) of the base substrate 130, stopping on the buried oxide layer 124. The base substrate 130 may alternatively be etched with a wet etchant such as KOH. However, KOH wet etchant attacks silicon preferentially in the (100) plane, and may product an anisotropic V-etch with tapered sidewalls. DRIE etching may be selected for more vertical sidewalls in the backside via openings 120A. After etching of the base substrate 130, the patterned positive photoresist can be removed by $O_2$ ashing followed by piranha etch resulting in the structure illustrated in FIGS. 8A-8B.

Referring to FIGS. 9A-10B, the silicon electrodes 110 and interconnects 104, 106 are patterned in a two part etching sequence. First, as illustrated in FIGS. 9A-9B the top silicon layer 140 is partially etched through, defining the patterns of the silicon electrodes 110 and interconnects 104, 106. In an embodiment, this may be accomplished with a thin patterned positive photoresist, DRIE etching approximately 5 μm of a 7-10 μm thick top silicon layer 140 in a timed etch. The patterned positive photoresist can be removed using $O_2$ ashing followed by piranha etch. In accordance with embodiments of the invention, openings in the photoresist 121 (illustrated in FIG. 9A only) on the edges of FIG. 9A correspond to the size of the trenches 116 used to define the silicon electrodes 110 and interconnects 104, 106, however, the openings in the photoresist 121 over the islands 144 corresponding to the joint trench 117 between silicon electrode mesa structures 112 may be larger than the gap between the islands 144. In this manner, the islands 144 in the patterned hard mask layer 142 can be used to form silicon electrode mesa structures 112 with higher gap resolution of the joint trench openings 117 between mesa structures when compared to using photoresist alone. In an embodiment, the joint trench 117 openings are at least wide enough to grow a dielectric layer 118 on side surfaces of the adjacent mesa structures 112 and to allow deflection of each silicon electrode 110 into the cavity 136. For example, the joint trenches 117 may be 2 μm wide or larger.

Second, as illustrated in FIGS. 10A-10B with islands 144 still present, DRIE etching is continued using islands 144 as a mask to form the silicon electrodes 110 including the protruding mesa structures 112, and silicon interconnects 104, 106, stopping on the underlying buried oxide layer 124. Upon completion of etching the silicon layer 140, a dry etching technique is performed to remove the islands 144, approximately 0.1 μm. In an embodiment, where only 0.1 μm of oxide is removed, and the buried oxide 124 is approximately 1.0 μm thick, significantly more than 0.1 μm of the exposed buried oxide 124 is not removed. In accordance with embodiments of the invention, the buried oxide 124 provides structural stability for the partially patterned SOI structure and significantly more than the thickness of the islands 144 is not removed from the buried oxide 124 is during removal of the islands 144. As illustrated in FIG. 10B, the buried oxide layer 124 is exposed in joint trenches 117 between the silicon electrodes, and trenches 116 around the silicon electrodes and between the interconnects.

Referring now to FIGS. 11A-11B, the front and back sides of the SOI wafer can then be oxidized in order to passivate the silicon electrodes, silicon interconnects, and backside via opening. In an embodiment, high temperature wet oxidation may be performed in order to grow an approximately 1 μm thick oxide layer 118 on the silicon electrodes 110, within joint trench 117 between the mesa structures 112, on the silicon interconnects 104, 106, and within trenches 116. In locations were the buried oxide layer 124 is already exposed, the buried oxide layer 124 thickness may increase or remain the same depending upon the pre-existing thickness. In an embodiment, oxide layer 118 is approximately the same thickness as buried oxide layer 124. An approximately 1 μm thick oxide passivation layer 133 is also simultaneously grown within the backside via openings 120A along sidewalls of the base substrate 130.

Referring now to FIGS. 12A-12B, a thick patterned positive photoresist is applied over the interconnects 104, 106 and silicon electrodes 110, followed by etching of the exposed buried oxide in joint trenches 117 and trench areas 137 which will correspond to the locations of cavities 136 to be formed. The patterned positive photoresist can be removed using $O_2$ ashing followed by piranha etch.

A dry oxide etch using a suitable dry etching technique may then be performed to create openings in the buried oxide layer 124 within the backside via openings 120A to expose a bottom surface of the patterned silicon layer 140 where silicon interconnects 106 are formed, as illustrated in FIGS. 13A-13B. In an embodiment, a thin positive photoresist is formed over the backside of the SOI wafer and within the backside via opening 120A and patterned. The buried oxide layer 124 is then etched to expose a bottom surface of the silicon layer 140. In an embodiment, etching of buried oxide layer 124 is performed with RIE. As illustrated, the openings in the buried oxide layer 124 are smaller (e.g. smaller diameter or cross-section) than the openings within the base substrate 130 (including the oxide passivation layer 133). In this manner, having a smaller opening within the buried oxide layer 124 than in the base substrate (including oxide passivation layer 133) protects against inadvertently etching through the oxide passivation layer 133, or undercutting the oxide passivation layer 133 and electrically shorting the backside via 120 with the base substrate 130. Due to lithographic tolerances and resolution capabilities, the openings within the buried oxide layer 124 may have a minimum cross-section of greater than 10 μm.

Referring now to FIGS. 14A-14B, a patterned conductive layer 122 is formed on the passivation layer 133 within the via openings 120A and in electrical contact with the bottom surface of the silicon interconnects 106. In an embodiment, the patterned conductive layer 122 is formed by sputtering through a shadow mask. In an embodiment, the patterned conductive layer 122 includes a first layer of 500 angstrom thick titanium (Ti), a middle layer of 500 angstrom thick titanium-tungsten (TiW), and a 1 μm to 2 μm thick outer layer of gold (Au). In an embodiment, the patterned conductive layer 122 makes ohmic contact with the silicon interconnects 106.

Referring now to FIGS. 15A-15B, one or more cavities 136 may then be etched in the base substrate 130 directly underneath the array of silicon electrodes such that the array of silicon electrodes are deflectable into the one or more cavities. In an embodiment, a separate cavity 136 is formed directly underneath each pair of silicon electrodes. In an embodiment, a single cavity 136 is formed directly underneath the array of silicon electrodes in electrical communication with the first and second interconnects 104. In an embodiment, cavities 136 are formed with a timed release etch into the base substrate 130 which undercuts the electrode leads 114 and mesa structures 112. For example, etching may be performed with a fluorine based chemistry such as $XeF_2$ or $SF_6$.

Following the formation of the one or more cavities 136, the SOI substrate may then be diced, for example using laser dicing, to form a compliant bipolar transfer head array including an array of compliant transfer heads 102 interconnected with silicon interconnects 104, 106 and vias 120 extending through the base substrate 130 from a backside of the base substrate to the patterned silicon layer 140 to electrically connect the silicon electrodes 110 with working circuitry of a transfer head assembly.

Figure 16A:
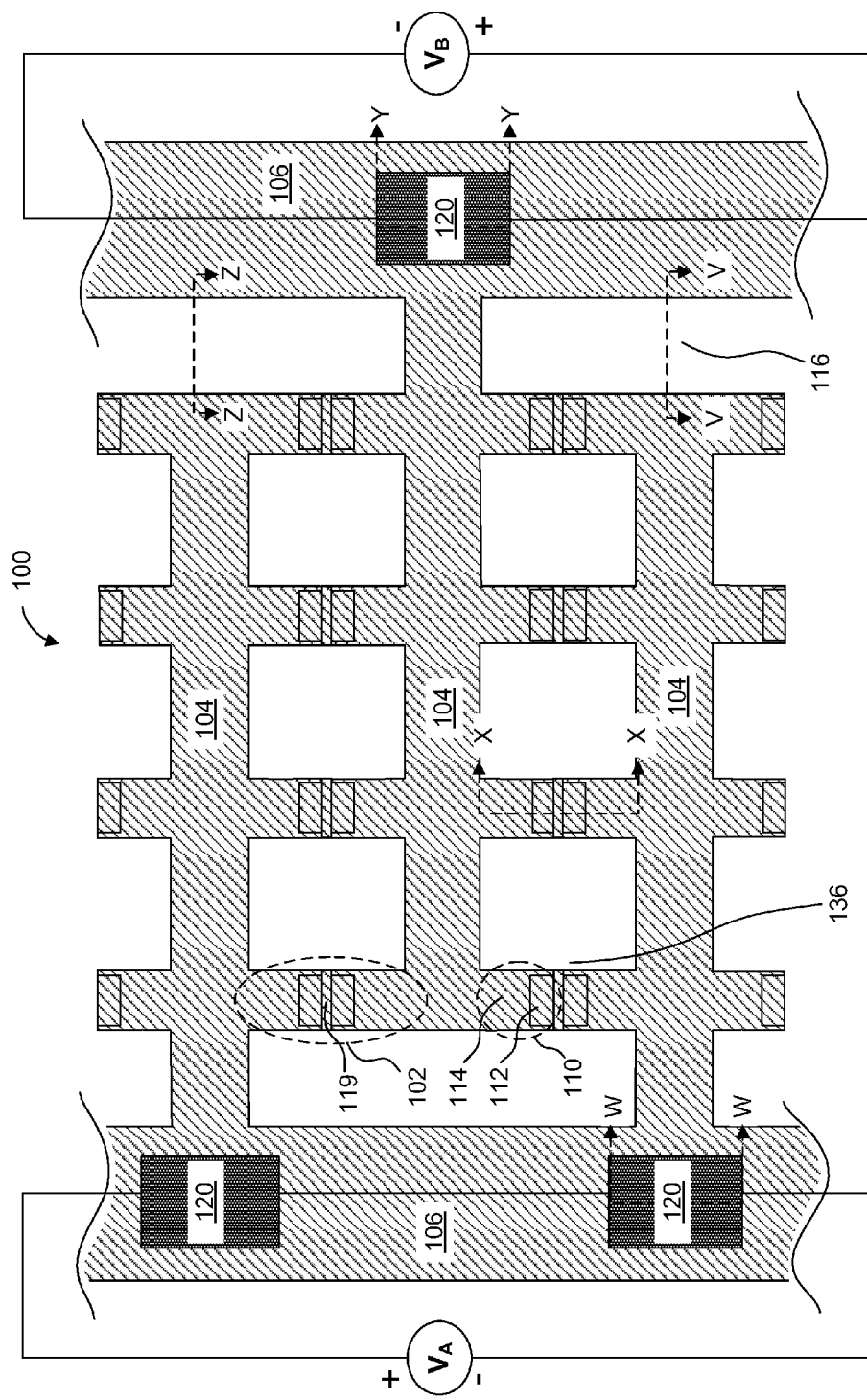
FIG. 16A is a plan view illustration of a compliant bipolar micro device transfer head array of double sided clamped supported beams and mesa joints in accordance with an embodiment of the invention.

FIG. 16A is a plan view illustration of a compliant bipolar micro device transfer head array of double sided clamped supported beams and mesa joints in accordance with an embodiment of the invention. The particular embodiment illustrated in FIG. 16A is similar to the embodiment illustrated in FIG. 1A with one difference being that the pair of silicon electrodes 110 for each compliant bipolar transfer head 102 are joined with an oxide joint 119 between the pair of mesa structures 112. As a result of the oxide joint 119, the pair of silicon electrodes in a bipolar micro device transfer head are in the form of a doubled sided clamed supported beam, which is supported at opposite sides with silicon interconnects 104. A single cavity 136 may be formed underneath an array of transfer heads 102 spanning between a pair of silicon interconnects 104. A plurality of cavities 136 may be formed between a plurality of pairs of silicon interconnects 104 or a single cavity 136 may be formed between a plurality of pairs of silicon interconnects 104. Trenches 116 may also be formed in the patterned silicon layer defining the silicon electrodes 110 and silicon interconnects 104, 106.

Figure 16B:
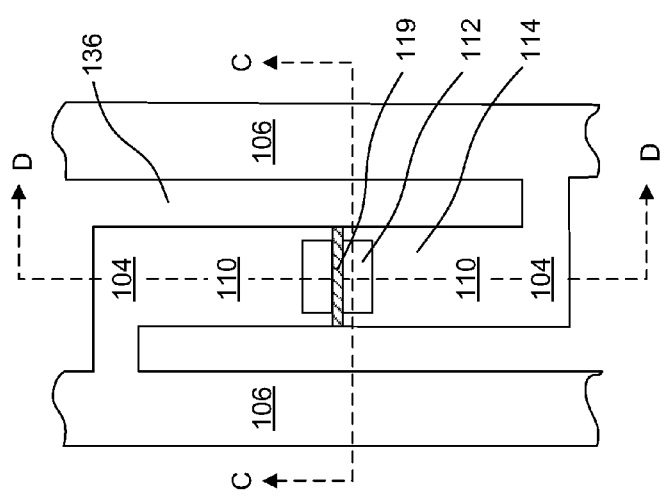
FIG. 16B is a plan view illustration of a compliant bipolar micro device transfer head with a double sided clamped supported beam and mesa joint in accordance with an embodiment of the invention.
Figure 16D:
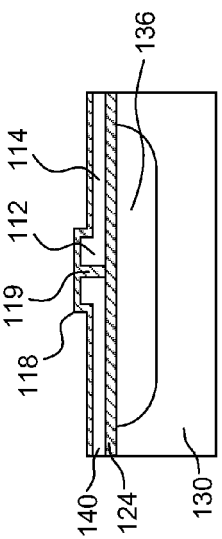
FIG. 16D is a cross-sectional side view illustration taken along longitudinal line D-D of the compliant bipolar micro device transfer head illustrated in FIG. 16B in accordance with an embodiment of the invention.
Figure 16C:
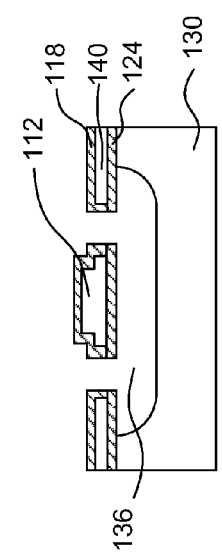
FIG. 16C is a cross-sectional side view illustration taken along transverse line C-C of the compliant bipolar micro device transfer head illustrated in FIG. 16B in accordance with an embodiment of the invention.

FIG. 16B is a plan view illustration of a compliant bipolar micro device transfer head with a double sided clamped supported beam and mesa joint in accordance with an embodiment of the invention. FIG. 16C is a cross-sectional side view illustration taken along transverse line C-C of the compliant bipolar micro device transfer head illustrated in FIG. 16B in accordance with an embodiment of the invention. FIG. 16D is a cross-sectional side view illustration taken along longitudinal line D-D of the compliant bipolar micro device transfer head illustrated in FIG. 16B in accordance with an embodiment of the invention. Similar to the embodiments illustrated in FIGS. 1B-1D, only a single transfer head 102 is illustrated in FIG. 16B as spanning between and being supported by two silicon trace interconnects 104, though an array of transfer heads may span between the silicon interconnects 104 in accordance with embodiments of the invention. The pair of silicon electrodes 110 for each compliant bipolar transfer head 102 are joined with an oxide joint 119 between the pair of mesa structures 112. In the embodiment illustrated, the oxide joint 119 is parallel to the silicon interconnects 104. As illustrated in FIGS. 16C-16D, both the silicon electrode mesa structures 112 and leads 114 extend over and are deflectable into a cavity 136 between the base substrate 130 and the silicon electrode 110. In the embodiment illustrated in FIG. 16D, the oxide joint 119 is on and in direct contact with the buried oxide layer 124.

FIGS. 17A-24B illustrate a method of forming a compliant bipolar micro device transfer head including a double sided clamped supported beam and an oxide joint between and connecting the pair of silicon electrodes, and topside and backside via openings in accordance with an embodiment of the invention. In an embodiment, the processing sequence leading up to FIGS. 17A-17B may be identical to the processing sequence of FIGS. 5A-8B with one difference being the distance between islands 144. As described in further detail in the following description, the patterning of islands 144 corresponds to the mesa structures 112 to be subsequently formed. Furthermore, the distance between islands 144 corresponds to the width of the oxide joint 119 which is formed between and connects the pair of silicon electrodes 110. Accordingly, since the oxide joint 119 connects the pair of silicon electrodes 110 in the double sided clamped supported beam configuration, the distance between islands 144 in FIGS. 17A-17B, may be less than the distance between the islands 144 in FIGS. 8A-8B. For example, the distance between islands may be sufficiently small to allow for the joint trench 117 to be completely filled with oxide thermally grown from mesa structures 112. For example, joint trenches 117 may be 2 µm wide or less.

Referring to FIGS. 17A-18B, the silicon electrodes 110 and interconnects 104, 106 may be patterned in a two part etching sequence. First, as illustrated in FIGS. 17A-17B the top silicon layer 140 is partially etched through, defining the patterns of the silicon electrodes 110 and interconnects 104, 106. In an embodiment, this may be accomplished with a thin patterned positive photoresist, DRIE etching approximately 5 µm of a 7-10 µm thick top silicon layer 140 in a timed etch. In accordance with embodiments of the invention, openings in the photoresist 121 (illustrated in FIG. 17A only) on the edges of FIG. 17A correspond to the size of the trenches 116 used to define the silicon electrodes 110 and interconnects 104, 106, however, the openings in the photoresist 121 over the islands 144 corresponding to the joint trench 117 between silicon electrode mesa structures 112 may be larger than the gap between the islands 144. In this manner, the islands 144 in the patterned hard mask layer 142 can be used to form silicon electrode mesa structures 112 with higher gap resolution of the joint trench openings 117 between mesa structures when compared to using photoresist alone. In this manner, the islands 144 in the patterned hard mask layer 142 can be used to form silicon electrode mesa structures 112 with higher gap resolution between mesa structures when compared to using photoresist alone, which may assist in increasing electrode active area and resultant grip pressure across the array of compliant transfer heads. For example, as micro device size decreases a narrower gap between mesa structures may increase the available electrode space with regard to a micro device to be picked up. The patterned positive photoresist can be removed using $O_2$ ashing followed by piranha etch.

Second, as illustrated in FIGS. 18A-18B with islands 144 still present, DRIE etching is continued using islands 144 as a mask to form the silicon electrodes 110 including the protruding mesa structures 112, and interconnects 104, 106, stopping on the underlying buried oxide layer 124. Upon completion of etching the silicon layer 140, a dry etching technique is performed to remove the islands 144, approximately 0.1 µm. In an embodiment, where only 0.1 µm of oxide is removed, and the buried oxide 124 is approximately 1.0 µm thick, significantly more than 0.1 µm of the exposed buried oxide 124 is not removed. In accordance with embodiments of the invention, the buried oxide 124 provides structural stability for the partially patterned SOI structure and significantly more than the thickness of the islands 144 is not removed from the buried oxide 124 is during removal of the islands 144.

Referring now to FIGS. 19A-19B, the front and back sides of the SOI wafer can then be oxidized in order to passivate the silicon electrodes, silicon interconnects, and backside via opening. In an embodiment, high temperature wet oxidation may be performed in order to grow an approximately 1 µm thick oxide layer 118 on the silicon electrodes 110, within joint trench 117 between the mesa structures 112, on the silicon interconnects 104, 106, and within trenches 116. As described above, where oxide layer 118 is grown within and fills joint trench 117, the oxide layer forms oxide joint 119. In an embodiment, oxide joint 119 completely fills joint trench 117. In locations were the buried oxide layer 124 is already exposed, the buried oxide layer 124 thickness may increase or remain the same during thermal oxidation depending upon the pre-existing thickness. In an embodiment, oxide layer 118 is approximately the same thickness as buried oxide layer 124. An approximately 1 µm thick oxide passivation layer 133 is also simultaneously grown within the backside via openings 120A along sidewalls of the base substrate 130.

Referring now to FIGS. 20A-20B, openings (which will become part of via openings 120B) are formed in the top dielectric layer 118 to expose the patterned silicon layer 140 at regions of silicon interconnects 106 directly above the backside via openings 120A and at trench areas 137 where the one or more cavities 136 will be formed. Trench area 137 openings are also simultaneously formed in buried oxide layer 124 to expose the base substrate 130 where the one or more cavities 136 will be formed. Openings may be formed in top dielectric layer 118 and buried oxide layer 124 with a thick patterned positive photoresist, followed by dry etching of the top dielectric layer 118. The patterned photoresist is then removed by $O_2$ ashing followed by piranha etch resulting in the structure in FIGS. 20A-20B. Combining the etching and patterning steps to form via openings 120B and trench area 137 openings also may reduce processing operations and number of masks required.

Referring now to FIGS. 21A-21B, openings are formed in the silicon layer 140 and buried oxide layer 124 to form a topside via opening 120B which connects with backside via opening 120A. Openings may be formed in the silicon layer 140 and buried oxide layer 124 by forming a thick patterned positive photoresist, followed by DRIE of the silicon layer 140 stopping on the buried oxide layer 124, followed by RIE through the buried oxide layer 124. The patterned photoresist is then removed by $O_2$ ashing followed by piranha etch resulting in the structure in FIGS. 21A-21B. In this manner, forming the openings through the buried oxide layer 124 when forming the topside via openings 120B may avoid the lithographic challenges associated with forming an opening in the buried oxide layer 124 from the backside of the SOI structure without adversely affecting the passivation layer 133 along the sidewalls of the via openings 120A.

A patterned conductive layer 123 may then be formed over the exposed top surface of the silicon interconnects 106 and within an interior side surface of the silicon interconnects 106, as illustrated in FIGS. 22A-22B. In this manner, partially forming conductive layer 123 over the top surface of the silicon interconnect 106 can provide greater surface area for ohmic contact with the silicon interconnects 106. Due to the closer proximity of the silicon interconnect 106 to the top surface of the SOI structure than the backside surface of the SOI structure, in accordance with some embodiments, it may be more efficient to form a layer of conductive layer 123 within the interior side surface of interconnect 106 from above the top surface of the SOI structure as opposed to from the back surface of the SOI structure. In an embodiment, the patterned conductive layer 123 is formed by sputtering through a shadow mask. In an embodiment, the patterned conductive layer 123 includes a first layer of 500 angstrom thick titanium (Ti), a middle layer of 500 angstrom thick titanium-tungsten (TiW), and a 1 µm to 2 µm thick outer layer of gold (Au). In an embodiment, the patterned conductive layer 123 makes ohmic contact with the silicon interconnects 106.

Referring now to FIGS. 23A-23B, a patterned conductive layer 122 may be formed on the passivation layer 133 within the via openings 120A and in electrical contact with the patterned conductive layer 123. Conductive layer 122 may be formed from the same or different material from conductive layer 123, and may have the same or different thicknesses. In an embodiment, conductive layer 123 has a thicker layer of gold.

Referring now to FIGS. 24A-24B, one or more cavities 136 may then be etched in the base substrate 130 directly underneath the array of silicon electrodes such that the array of silicon electrodes are deflectable into the one or more cavities. In an embodiment, a separate cavity 136 is formed directly underneath each pair of silicon electrodes. In an embodiment, a single cavity 136 is formed directly underneath the array of silicon electrodes in electrical communication with the first and second interconnects 104. In an embodiment, cavities 136 are formed with a timed release etch into the base substrate 130 which undercuts the electrode leads 114 and mesa structures 112. For example, etching may be performed with a fluorine based chemistry such as $XeF_2$ or $SF_6$. In an embodiment, the one or more cavities 136 are approximately 15 µm deep.

Following the formation of the one or more cavities 136, the SOI substrate may then be diced, for example using laser dicing, to form a compliant bipolar transfer head array including an array of compliant transfer heads 102 interconnected with silicon interconnects 104, 106 and vias 120 extending through the base substrate 130 from a backside of the base substrate to the patterned silicon layer 140, and through the patterned silicon layer 140, to electrically connect the silicon electrodes 110 with working circuitry of a transfer head assembly.

FIGS. 25A-30B illustrate a method of forming a compliant bipolar micro device transfer head including a double sided clamped supported beam and a deposited dielectric layer 126, an oxide joint 119 between and connecting the pair of silicon electrodes 110, and topside and backside via openings in accordance with an embodiment of the invention. In an embodiment, the processing sequence leading up to FIGS. 25A-25B may be identical to the processing sequence of FIGS. 5A-7B and FIGS. 17A-19B as described above. Referring now to FIGS. 25A-25B, in an embodiment openings are formed in the top dielectric layer 118 directly above the backside via openings 120A and directly over the mesa structures 112.

Referring now to FIGS. 25A-25B, openings are formed in the top dielectric layer 118 to expose the mesa structures 112 and oxide joint 119 (and optionally portions of electrode leads 114), and openings (which will become part of via openings 120B) are formed in the top dielectric layer 118 directly above the backside via openings 120A. Trench area 137 openings are also simultaneously formed in buried oxide layer 124 to expose the base substrate 130 where the one or more cavities 136 will be formed. In the particular embodiment illustrated, the oxide joint 119 is not completely removed from between the adjacent mesa structures 112 in a bipolar electrode transfer head 102. Openings may be formed in top dielectric layer 118 and buried oxide layer 124 with a thick patterned positive photoresist, followed by dry etching of the top dielectric layer 118. In an embodiment a timed dry oxide etch is performed to ensure oxide joint 119 is not completely removed. In an embodiment, top dielectric layer 118 and buried oxide layer 124 have approximately the same thickness, and may be completely removed in a timed dry oxide etch while removing less than 0.2 µm of the oxide joint 119 thickness. The patterned photoresist is then removed by $O_2$ ashing followed by piranha etch resulting in the structure in FIGS. 25A-25B. Combining the etching and patterning steps to form via openings 120A and trench area 137 openings also may reduce processing operations and number of masks required.

Referring now to FIGS. 26A-26B, in an embodiment, a second dielectric layer 126 is formed over the top surface including the patterned dielectric layer 118, patterned silicon layer 140 and oxide joint 119, followed by patterning with a thick positive resist and etched. Upon completion of etching, the patterned second dielectric layer 126 covers the mesa structures 112 and may also cover a portion of the electrode leads 114 and patterned dielectric layer 118. The patterned second dielectric layer 126 is removed from over the patterned silicon layer 140 directly above the backside via openings 120A, and at trench areas 137 where the one or more cavities 136 will be formed. In an embodiment, the second dielectric layer may have a higher dielectric constant or dielectric breakdown strength than dielectric layer 118, and has a thickness between 0.5 µm-10 µm. For example, the second dielectric layer 126 a layer of $Al_2O_3$, $Ta_2O_5$, or $HfO_2$ deposited by atomic layer deposition (ALD).

Referring now to FIGS. 27A-27B, openings are formed in the silicon layer 140 and buried oxide layer 124 to form topside via openings 120B which connect with backside via openings 120A. Openings may be formed in the silicon layer 140 and buried oxide layer 124 by forming a thick patterned positive photoresist, followed by DRIE of the silicon layer 140 stopping on the buried oxide layer 124, followed by RIE through the buried oxide layer 124. The patterned photoresist is then removed by $O_2$ ashing followed by piranha etch resulting in the structure in FIGS. 27A-27B. In this manner, forming the openings through the buried oxide layer 124 when forming the topside via openings 120B may avoid the lithographic challenges associated with forming an opening in the buried oxide layer 124 from the backside of the SOI structure without adversely affecting the passivation layer 133 along the sidewalls of the via openings 120A.

A patterned conductive layer 123 is then formed over the exposed top surface of the silicon interconnects 106 and within an interior side surface of the silicon interconnects 106, as illustrated in FIGS. 28A-28B. In this manner, partially forming conductive layer 123 over the top surface of the silicon interconnect 106 can provide greater surface area for ohmic contact with the silicon interconnects 106. Due to the closer proximity of the silicon interconnect 106 to the top surface of the SOI structure than the backside surface of the SOI structure, in accordance with some embodiments, it may be more efficient to form a layer of conductive layer 123 within the interior side surface of interconnect 106 from above the top surface of the SOI structure as opposed to from the back surface of the SOI structure. In an embodiment, the patterned conductive layer 123 is formed by sputtering through a shadow mask. In an embodiment, the patterned conductive layer 123 includes a first layer of 500 angstrom thick titanium (Ti), a middle layer of 500 angstrom thick titanium-tungsten (TiW), and a 1 µm to 2 µm thick outer layer of gold (Au). In an embodiment, the patterned conductive layer 123 makes ohmic contact with the silicon interconnects 106.

A patterned conductive layer 122 may be formed on the passivation layer 133 within the via openings 120A and in electrical contact with the patterned conductive layer 123 as illustrated in FIGS. 29A-29B. Conductive layer 122 may be formed from the same or different material from conductive layer 123, and may have the same or different thicknesses. In an embodiment, conductive layer 123 has a thicker layer of gold. Conductive layers 122, 123 may form a continuous conductive layer along the via 120 side surfaces.

Referring now to FIGS. 30A-30B, one or more cavities 136 may then be etched in the base substrate 130 directly underneath the array of silicon electrodes such that the array of silicon electrodes are deflectable into the one or more cavities. In an embodiment, a separate cavity 136 is formed directly underneath each pair of silicon electrodes. In an embodiment, a single cavity 136 is formed directly underneath the array of silicon electrodes in electrical communication with the first and second interconnects 104. In an embodiment, cavities 136 are formed with a timed release etch into the base substrate 130 which undercuts the electrode leads 114 and mesa structures 112. For example, etching may be performed with a fluorine based chemistry such as $XeF_2$ or $SF_6$. In an embodiment, the one or more cavities 136 are approximately 15 μm deep.

Following the formation of the one or more cavities 136, the SOI substrate may then be diced, for example using laser dicing, to form a compliant bipolar transfer head array including an array of compliant transfer heads 102 interconnected with silicon interconnects 104, 106 and vias 120 extending through the base substrate 130 from a backside of the base substrate to the patterned silicon layer 140, and through the patterned silicon layer 140, to electrically connect the silicon electrodes 110 with working circuitry of a transfer head assembly.

FIGS. 31-37 illustrate various modifications of compliant bipolar micro device transfer heads spanning between silicon interconnects 104 in accordance with embodiments of the invention. While FIGS. 31-37 are illustrated separately from the processing sequences illustrated above, it is to be appreciated that many of the various modifications described with respect to FIGS. 31-37 can be implemented into the processing sequences previously described.

FIG. 31 is a plan view illustration and cross-sectional side view illustration taken along line A-A of a compliant bipolar micro device transfer head with cantilever beam and continuous joint in accordance with an embodiment of the invention. As illustrated, a silicon electrode cantilever beam may include a pair of silicon electrode leads 114 extending from two silicon interconnects 104, and pair mesa structures 112 separated by a continuous oxide joint 117 which is on and in direct contact with the buried oxide layer 124 and extends in a longitudinal length of the cantilever beam parallel to the pair of silicon interconnects 104. In such an embodiment, the oxide joint 117 electrically insulates the pair of silicon electrodes in the bipolar electrode configuration along a longitudinal length of the cantilever beam along both the pair silicon electrode leads 114 and pair of mesa structures 112. As illustrated, the silicon electrode leads 114 may include a bend 115 (illustrated as a 90 degree bend).

FIG. 32 is a plan view illustration and cross-sectional side view illustration taken along line A-A of a compliant bipolar micro device transfer head with cantilever beam and mesa joint in accordance with an embodiment of the invention. As illustrated, a silicon electrode cantilever beam may include a pair of silicon electrode leads 114 extending from two silicon interconnects 104, and pair mesa structures 112 separated by a mesa oxide joint 117 which is on and in direct contact with the buried oxide layer 124 and extends in a longitudinal length of the cantilever beam parallel to the pair of silicon interconnects 104. In such an embodiment, the oxide joint 117 electrically insulates the pair of silicon electrodes in the bipolar electrode configuration along a longitudinal length of the cantilever beam along the pair of mesa structures 112. A illustrated, the pair of silicon electrode leads 114 are physically separated by patterning and may include a bend 115 (illustrated as a 90 degree bend).

FIG. 33 is a plan view illustration and cross-sectional side view illustration taken along line A-A of a compliant bipolar micro device transfer head with double sided clamped beam and continuous joint in accordance with an embodiment of the invention. As illustrated, a silicon electrode double sided clamped beam may include a pair of bent silicon electrode leads 114 extending from two silicon interconnects 104, and pair mesa structures 112 separated by a continuous oxide joint 117 which is on and in direct contact with the buried oxide layer 124 and extends in a longitudinal length of the cantilever beam parallel to the pair of silicon interconnects 104. In such an embodiment, the oxide joint 117 electrically insulates the pair of silicon electrodes in the bipolar electrode configuration along a longitudinal length of the double sided clamped beam along both the pair silicon electrode leads 114 and pair of mesa structures 112. As illustrated, the silicon electrode leads 114 may each include bends 115 (illustrated as 90 degree bends) at proximal and distal locations where the electrode leads extend from the silicon interconnects 104.

Figure 34:
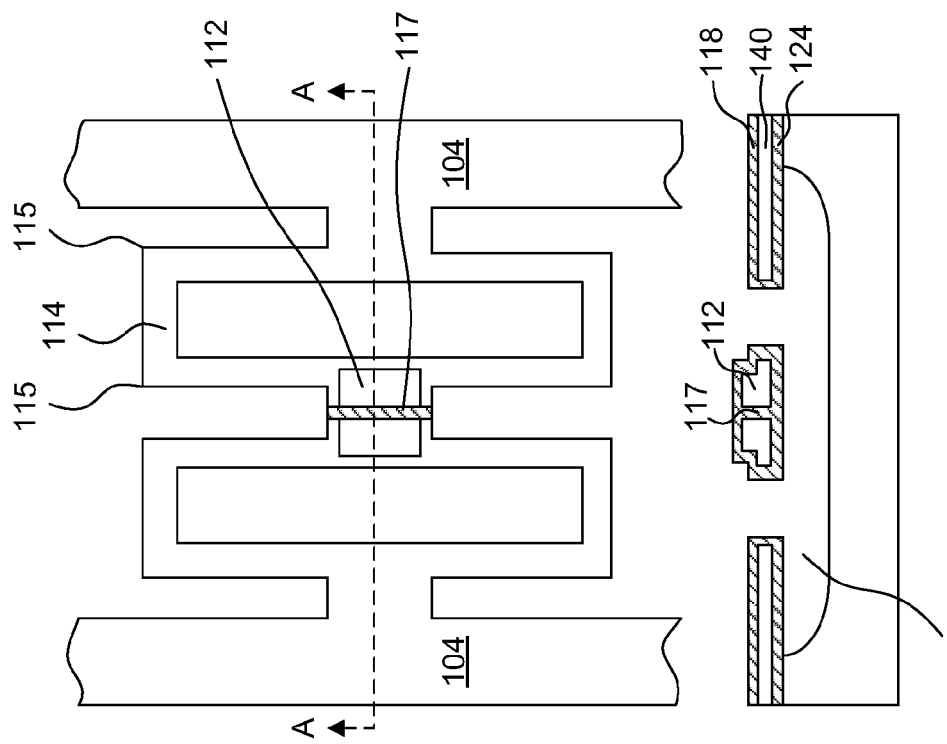
FIG. 34 is a plan view illustration and cross-sectional side view illustration taken along line A-A of a compliant bipolar micro device transfer head with a double sided clamped beam including a pair of silicon electrodes with double bends and a mesa joint in accordance with an embodiment of the invention.

FIG. 34 is a plan view illustration and cross-sectional side view illustration taken along line A-A of a compliant bipolar micro device transfer head with a double sided clamped beam including a pair of silicon electrodes with double bends and a mesa joint in accordance with an embodiment of the invention. As illustrated, a silicon electrode double sided clamped beam may include a pair of silicon electrode leads 114 extending from two silicon interconnects 104, each lead 114 with a double bend 115, and pair mesa structures 112 separated by a mesa oxide joint 117 which is on and in direct contact with the buried oxide layer 124 and extends in a transverse width of the double sided clamped beam parallel to the pair of silicon interconnects 104. In such an embodiment, the oxide joint 117 electrically insulates the pair of silicon electrodes in the bipolar electrode configuration along a transverse width of the cantilever beam between the pair of mesa structures 112, and the pair of silicon electrode leads 114 are physically separated by patterning. In the embodiment illustrated, each electrode lead 114 is split, so that the beam configuration assumes an 8-shape configuration with the silicon electrode leads 114.

Figure 35:
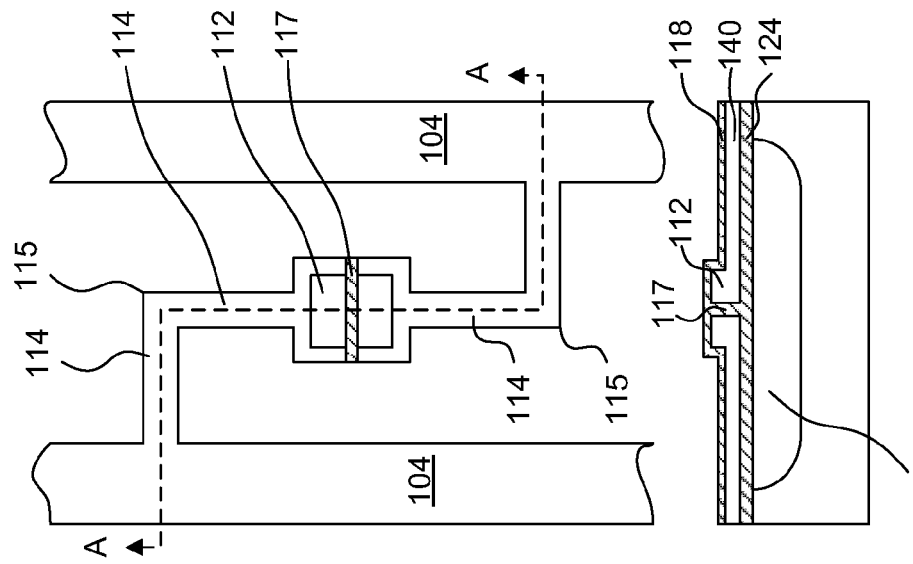
FIG. 35 is a plan view illustration and cross-sectional side view illustration taken along line A-A of a compliant bipolar micro device transfer head with a double sided clamped beam including a pair of silicon electrodes with single bends and a mesa joint in accordance with an embodiment of the invention.

FIG. 35 is a plan view illustration and cross-sectional side view illustration taken along line A-A of a compliant bipolar micro device transfer head with a double sided clamped beam including a pair of silicon electrodes with single bends and a mesa joint in accordance with an embodiment of the invention. As illustrated, a silicon electrode double sided clamped beam may include a pair of silicon electrode leads 114 extending from two silicon interconnects 104, each lead 114 with a single bend 115, and pair mesa structures 112 separated by a mesa oxide joint 117 which is on and in direct contact with the buried oxide layer 124 and extends in a transverse width of the double sided clamped beam perpendicular to the pair of silicon interconnects 104. In such an embodiment, the oxide joint 117 electrically insulates the pair of silicon electrodes in the bipolar electrode configuration along a transverse width of the double sided clamped beam between the pair of mesa structures 112, and the pair of silicon electrode leads 114 are physically separated by patterning.

FIGS. 36-37 are plan view illustrations and cross-sectional side view illustrations taken along line A-A of a compliant bipolar micro device transfer head with a double sided clamped beam including a pair of silicon electrodes with double bends and a mesa joint in accordance with an embodiment of the invention. As illustrated, a silicon electrode double sided clamped beam may include a pair of silicon electrode leads 114 each with a double bend 115, and pair mesa structures 112 separated by a mesa oxide joint 117 which is on and in direct contact with the buried oxide layer 124 and extends in a transverse width of the double sided clamped beam parallel to the pair of silicon interconnects 104. In such an embodiment, the oxide joint 117 electrically insulates the pair of silicon electrodes in the bipolar electrode configuration along a transverse width of the double sided clamped beam between the pair of mesa structures 112. In the particular embodiment illustrated in FIG. 36, the beam is in a W-shape configuration. In the particular embodiment illustrated in FIG. 37, the beam is in an S-shape configuration.

Figure 38:
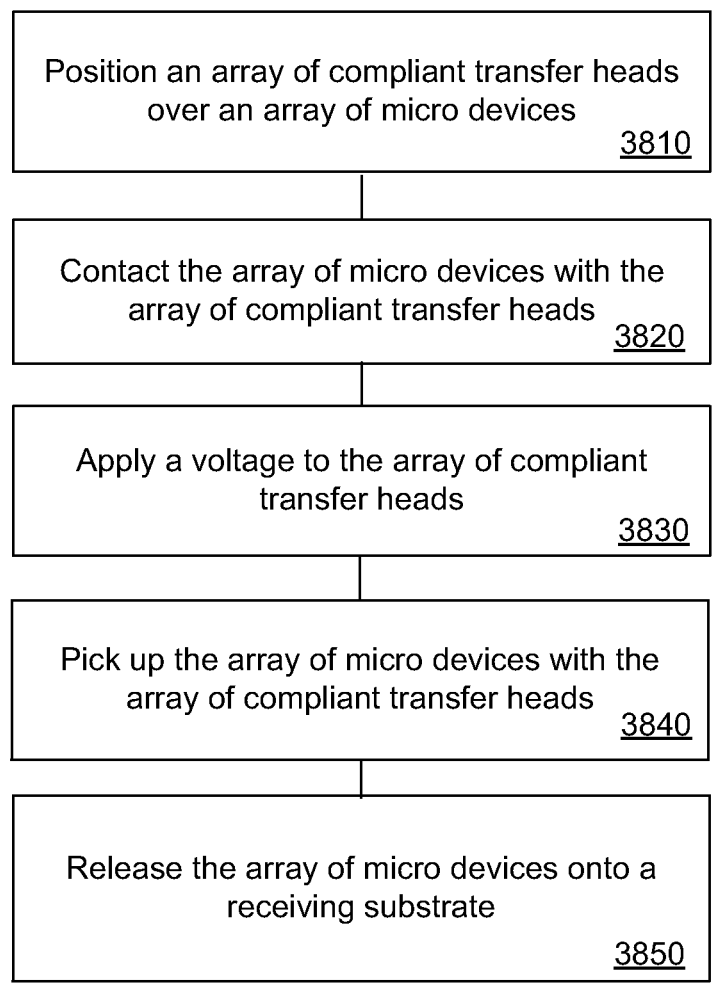
FIG. 38 is a flow chart illustrating a method of picking up and transferring an array of micro devices from a carrier substrate to a receiving substrate in accordance with an embodiment of the invention.

In accordance with embodiments of the invention, the dielectric layer 118 or 126 covering the mesa structures 112 has a suitable thickness and dielectric constant for achieving the required grip pressure for the micro device transfer head, and sufficient dielectric strength to not break down at the operating voltage. FIG. 38 is a flow chart illustrating a method of picking up and transferring an array of micro devices from a carrier substrate to a receiving substrate in accordance with an embodiment of the invention. At operation 3810 an array of compliant transfer heads is positioned over an array of micro devices on a carrier substrate. FIG. 39 is a cross-sectional side view illustration of an array of compliant bipolar micro device transfer heads 102 positioned over an array of micro devices on a carrier substrate 200 in accordance with an embodiment of the invention. At operation 3820 the array of micro devices are contacted with the array of compliant transfer heads. In an alternative embodiment, the array of compliant transfer heads is positioned over the array of micro devices with a suitable air gap separating them which does not significantly affect the grip pressure, for example, 1 nm to 10 nm. FIG. 40 is a cross-sectional side view illustration of an array of compliant bipolar micro device transfer heads 102 in contact with an array of micro devices 202 in accordance with an embodiment of the invention. As illustrated, the pitch of the array of compliant transfer heads 102 is an integer multiple of the pitch of the array of micro devices 202. At operation 3830 a voltage is applied to the array of compliant transfer heads 102. The voltage may be applied from the working circuitry within a compliant transfer head assembly 160 in electrical connection with the array of compliant transfer heads through vias 120. At operation 3840 the array of micro devices is picked up with the array of compliant transfer heads. FIG. 41 is a cross-sectional side view illustration of an array of compliant transfer heads 102 picking up an array of micro devices 202 in accordance with an embodiment of the invention. At operation 3850 the array of micro devices is then released onto a receiving substrate. For example, the receiving substrate may be, but is not limited to, a display substrate, a lighting substrate, a substrate with functional devices such as transistors or ICs, or a substrate with metal redistribution lines. FIG. 42 is a cross-sectional side view illustration of an array of micro devices 202 released onto a receiving substrate 300 in accordance with an embodiment of the invention.

While operations 3810-3850 have been illustrated sequentially in FIG. 38, it is to be appreciated that embodiments are not so limited and that additional operations may be performed and certain operations may be performed in a different sequence. For example, in one embodiment, an operation is performed to create a phase change in a bonding layer connecting the micro device to the carrier substrate prior to or while picking up the micro device. For example, the bonding layer may have a liquidus temperature less than 350° C., or more specifically less than 200° C. The bonding layer may be formed of a material which provides adhesion to the carrier substrate, yet also a medium from which the micro device is readily releasable. In an embodiment, the bonding layer is a material such as indium or an indium alloy. If a portion of the bonding layer is picked up with the micro device, additional operations can be performed to control the phase of the portion of the bonding layer during subsequent processing. For example, heat can be applied to the bonding layer from a heat source located within the transfer head assembly 160, carrier substrate 200, and/or receiving substrate 300.

Furthermore, operation 3830 of applying the voltage to create a grip pressure on the micro devices can be performed in various orders. For example, the voltage can be applied prior to contacting the array of micro devices with the array of compliant transfer heads, while contacting the micro devices with the array of compliant transfer heads, or after contacting the micro devices with the array of compliant transfer heads. The voltage may also be applied prior to, while, or after creating a phase change in the bonding layer.

Where the compliant transfer heads 102 include bipolar silicon electrodes, an alternating voltage is applied across the pair of silicon electrodes in each compliant transfer head 102 so that at a particular point when a negative voltage is applied to one silicon electrode, a positive voltage is applied to the other silicon electrode in the pair, and vice versa to create the pickup pressure. Releasing the micro devices from the compliant transfer heads 102 may be accomplished with a varied of methods including turning off the voltage sources, lowering the voltage across the pair of silicon electrodes, changing a waveform of the AC voltage, and grounding the voltage sources. Release may also be accomplished by discharge associated with placing the micro devices on the receiving substrate.

In utilizing the various aspects of this invention, it would become apparent to one skilled in the art that combinations or variations of the above embodiments are possible for forming a compliant bipolar micro device transfer head and head array, and for transferring a micro device and micro device array. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A method of forming a compliant bipolar transfer head array comprising:
   etching a top silicon layer of a silicon-on-insulator stack to form a first array of silicon electrodes electrically connected with a first silicon interconnect, and a second array of silicon electrodes aligned with the first array of silicon electrodes and electrically connected with a second silicon interconnect to form an array of bipolar silicon electrode pairs, each silicon electrode in the first and second arrays of silicon electrodes including an electrode lead and a mesa structure that protrudes above the first and second silicon interconnects;
   forming a dielectric layer over the first and second arrays of silicon electrodes; and
   etching one or more cavities in the base substrate directly underneath the first and second arrays of silicon electrodes such that each silicon electrode in the first and second arrays of silicon electrodes is deflectable into the one or more cavities.

2. The method of claim 1, wherein etching one or more cavities in the base substrate comprises reactive ion etching with a fluorinated plasma selected from the group consisting of $SF_6$ and $XeF_2$.

3. The method of claim 1, wherein etching one or more cavities in the base substrate comprises etching a separate cavity in the base substrate directly underneath each bipolar silicon electrode pair.

4. The method of claim 1, wherein etching one or more cavities in the base substrate comprises etching a single cavity in the base substrate directly underneath the array of bipolar silicon electrode pairs.

5. The method of claim 4, further comprising etching the single cavity in the base substrate such that it wraps around an end of one of the first and second silicon interconnects.

6. The method of claim 1, wherein etching the top silicon layer of the silicon-on-insulator stack exposes a buried oxide layer.

7. The method of claim 6, further comprising forming a patterned layer over the buried oxide layer and the dielectric layer after forming the dielectric layer over the first and second arrays of silicon electrodes, and etching through the buried oxide layer to expose a portion of the base substrate.

8. The method of claim 7, further comprising etching the one or more cavities in the base substrate directly underneath the first and second arrays of silicon electrodes using the dielectric layer as an etching mask.

9. The method of claim 6, wherein forming the dielectric layer comprises thermal oxidation of the first and second arrays of silicon electrodes.

10. The method of claim 6, further comprising etching an array of joint trenches between the mesa structures of the first and second arrays of silicon electrodes simultaneously with etching the top silicon layer of the silicon-on-insulator stack to form the first and second arrays of silicon electrodes, wherein etching the array of joint trenches exposes the buried oxide layer.

11. The method of claim 10, further comprising forming the dielectric layer within the array of joint trenches and in direct contact with the buried oxide layer simultaneously with forming the dielectric layer over the first and second arrays of silicon electrodes.

12. The method of claim 11, wherein forming the dielectric layer comprises thermal oxidation of the first and second arrays of silicon electrodes.

13. The method of claim 12, further comprising completely filling the array of joint trenches with the dielectric layer to form an array of oxide joints between the first and second arrays of silicon electrodes.

14. The method of claim 6, further comprising etching a first backside via opening through the base substrate directly underneath the first silicon interconnect, and etching a second backside via opening through the base substrate directly underneath the second silicon interconnect.

15. The method of claim 14, further comprising, forming a passivation layer within the first and second backside via openings, wherein forming the passivation layer comprises simultaneously thermally oxidizing the first and second arrays of silicon electrodes and the base substrate within the first and second backside via openings.

16. The method of claim 15, further comprising forming a patterned conductive layer within the first and second via openings to make electrical contact with the first and second silicon interconnects.

17. The method of claim 16, wherein forming the patterned conductive layer comprises depositing the patterned conductive layer through a shadow mask.

18. The method of claim 7, further comprising etching through the dielectric layer to expose a first portion of the first silicon interconnect and a second portion of the second silicon interconnect simultaneously with etching through the buried oxide layer to expose the portion of the base substrate.

19. The method of claim 18, further comprising etching a first topside via opening through the exposed first portion of the first silicon interconnect and the buried oxide layer, etching a second topside via opening through the exposed second portion of the second silicon interconnect and the buried oxide layer, and forming a patterned conductive layer within the first and second topside via openings to make electrical contact with the first and second silicon interconnects.

20. The method of claim 7, further comprising etching through the dielectric layer to expose each of the mesa structures simultaneously with etching through the buried oxide layer to expose the portion of the base substrate.

21. The method of claim 20, further comprising forming a patterned second dielectric layer over each of the mesa structures.

22. The method of claim 21, wherein forming the patterned second dielectric layer comprises blanket depositing the second dielectric layer, and removing a portion of the second dielectric layer.

23. The method of claim 22, wherein blanket depositing the second dielectric layer comprises atomic layer deposition.

24. The method of claim 7, further comprising etching through the dielectric layer to expose a first portion of the first silicon interconnect, a second portion of the second silicon interconnect, and each of the mesa structures simultaneously with etching through the buried oxide layer to expose the portion of the base substrate.

25. The method of claim 24, further comprising etching a first topside via opening through the exposed first portion of the first silicon interconnect and the buried oxide layer, etching a second topside via opening through the exposed second portion of the second silicon interconnect and the buried oxide layer, and forming a patterned conductive layer within the first and second topside via openings to make electrical contact with the first and second silicon interconnects.

26. The method of claim 25, wherein etching the one or more cavities further comprises using the second dielectric layer formed over each of the mesa structures and the conductive layer formed within the first and second topside via openings as an etching mask.

* * * * *